United States Patent
Lee et al.

(10) Patent No.: US 9,570,714 B2
(45) Date of Patent: Feb. 14, 2017

(54) ORGANIC LAYER DEPOSITION ASSEMBLY, ORGANIC LAYER DEPOSITION APPARATUS, ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Myung-Ki Lee, Yongin (KR); Sung-Bong Lee, Yongin (KR); Dong-Seob Jeong, Yongin (KR); Mu-Hyun Kim, Yongin (KR)

(73) Assignee: Samsung Display Co., Ltd, Yongin-si (KR)

( * ) Notice: Subject to any disclaimer, the term of this patent is extended or adjusted under 35 U.S.C. 154(b) by 86 days.

(21) Appl. No.: 13/794,659

(22) Filed: Mar. 11, 2013

(65) Prior Publication Data

US 2014/0034917 A1 Feb. 6, 2014

(30) Foreign Application Priority Data

Aug. 3, 2012 (KR) ........................ 10-2012-0085389

(51) Int. Cl.
*H01L 51/56* (2006.01)
*H01L 51/52* (2006.01)
(Continued)

(52) U.S. Cl.
CPC ............. *H01L 51/56* (2013.01); *C23C 14/042* (2013.01); *C23C 14/24* (2013.01); *H01L 51/0011* (2013.01); *H01L 51/52* (2013.01)

(58) Field of Classification Search
CPC ........ C23C 16/54; C23C 14/243; H01L 51/56; H01L 51/52
(Continued)

(56) References Cited

U.S. PATENT DOCUMENTS

2002/0076847 A1  6/2002  Yamada et al.
2004/0124781 A1  7/2004  Bae et al.
(Continued)

FOREIGN PATENT DOCUMENTS

CN       102005541 A    4/2011
JP       2002-175878    6/2002
(Continued)

OTHER PUBLICATIONS

Patent Abstracts of Japan, and English machine translation of Japanese Publication 2003-297562 dated Oct. 17, 2003, (21 pages).
(Continued)

*Primary Examiner* — Parviz Hassanzadeh
*Assistant Examiner* — Nathan K Ford
(74) *Attorney, Agent, or Firm* — Lewis Roca Rothgerber Christie LLP

(57) ABSTRACT

An organic layer deposition assembly, an organic layer deposition apparatus, an organic light-emitting display apparatus, and a method of manufacturing the organic light-emitting display apparatus, in order to improve a characteristic of a deposited layer, the organic layer deposition assembly including a deposition source for discharging a deposition material; a deposition source nozzle unit disposed at a side of the deposition source, and including a plurality of deposition source nozzles; and a patterning slit sheet disposed while facing the deposition source nozzle unit, and including a plurality of patterning slits and one or more alignment confirmation pattern slits that are formed at edge portions of the plurality of patterning slits, wherein the deposition material that is discharged from the deposition source passes through the patterning slit sheet and then is formed on the substrate, while a deposition process is performed.

12 Claims, 14 Drawing Sheets

(51) Int. Cl.
  *H01L 51/00* (2006.01)
  *C23C 14/04* (2006.01)
  *C23C 14/24* (2006.01)

(58) Field of Classification Search
  USPC .......................................................... 118/726
  See application file for complete search history.

(56) References Cited

U.S. PATENT DOCUMENTS

| | | |
|---|---|---|
| 2008/0115729 A1 | 5/2008 | Oda et al. |
| 2011/0045617 A1* | 2/2011 | Kang et al. ..................... 438/22 |
| 2011/0052791 A1 | 3/2011 | Jo et al. |
| 2011/0168986 A1* | 7/2011 | Lee ....................... C23C 14/042 |
| | | 257/40 |

FOREIGN PATENT DOCUMENTS

| | | |
|---|---|---|
| JP | 2003-157973 | 5/2003 |
| JP | 2003-297562 | 10/2003 |
| JP | 2005-148335 A | 6/2005 |
| KR | 10-2004-0062371 A | 7/2004 |

OTHER PUBLICATIONS

SIPO Office Action dated Dec. 12, 2016, for corresponding Chinese Patent Application No. 201310200264.7 (7 pages).

\* cited by examiner

ORGANIC LAYER DEPOSITION ASSEMBLY, ORGANIC LAYER DEPOSITION APPARATUS, ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0085389, filed on Aug. 3, 2012, in the Korean Intellectual Property Office, the disclosure of which is incorporated herein in its entirety by reference.

BACKGROUND

1. Field

The following description relates to an organic layer deposition assembly, an organic layer deposition apparatus, an organic light-emitting display apparatus and a method of manufacturing the organic light-emitting display apparatus, and more particularly, to an organic layer deposition assembly, an organic layer deposition apparatus, an organic light-emitting display apparatus, and a method of manufacturing the organic light-emitting display apparatus, in order to improve a characteristic of a deposited layer.

2. Description of the Related Art

Recently, display apparatuses have been replaced with portable thin flat panel display apparatuses. Among the flat panel display apparatuses, organic light-emitting display apparatuses are self-emissive display devices having wide viewing angles and excellent contrast ratios, and high response speeds, and thus, are regarded as next-generation display apparatuses.

An organic light-emitting display apparatus includes an intermediate layer, a first electrode, a second electrode, and various thin layers. The intermediate layer includes an organic emission layer (EML), and when a voltage is applied to the first and second electrodes, visible rays are generated by the organic EML.

In order to form the intermediate layer and the various thin layers included in the organic light-emitting display apparatus, a deposition process may be used. In this regard, a deposition mask is generally used to form a specific pattern on a substrate via the deposition process.

However, it is difficult to form a fine and minute pattern in the deposition process using the deposition mask. In particular, as a size of the organic light-emitting display apparatus increases, it is difficult to perform an alignment between the substrate and the deposition mask, which makes it difficult to control a characteristic of a deposited layer, i.e., a minute pattern of the deposited layer.

As a result, there is a limit in the improvement of the characteristic of the deposited layer.

SUMMARY OF THE INVENTION

Aspects of embodiments of the present invention are directed toward an organic layer deposition assembly, an organic layer deposition apparatus, an organic light-emitting display apparatus, and a method of manufacturing the organic light-emitting display apparatus, in order to easily improve a characteristic of a deposited layer.

According to an embodiment of the present invention, there is provided an organic layer deposition assembly for depositing an organic layer on a substrate, the organic layer deposition assembly including a deposition source for discharging a deposition material; a deposition source nozzle unit disposed at a side of the deposition source, and including a plurality of deposition source nozzles; and a patterning slit sheet disposed while facing the deposition source nozzle unit, and including a plurality of patterning slits and one or more alignment confirmation pattern slits that are formed at edge portions of the plurality of patterning slits, wherein the deposition material that is discharged from the deposition source passes through the patterning slit sheet and then is formed on the substrate, while a deposition process is performed.

The patterning slit sheet may include an intermediate region that is formed between adjacent patterning slits from among the plurality of patterning slits, and an outer region that surrounds the plurality of patterning slits, and the one or more alignment confirmation pattern slits may be formed at portions of the outer region.

The patterning slit sheet may be formed smaller than the substrate in one direction.

The plurality of deposition source nozzles may be formed at the deposition source nozzle unit along a first direction, the plurality of patterning slits may be formed along the first direction, and the organic layer deposition assembly may further include a shielding plate assembly including a plurality of shielding plates that are disposed along the first direction between the deposition source nozzle unit and the patterning slit sheet and that partition a space between the deposition source nozzle unit and the patterning slit sheet into a plurality of deposition spaces.

Each of the plurality of shielding plates may extend along a second direction that is substantially perpendicular to the first direction.

The shielding plate assembly may include a first shielding plate assembly including a plurality of first shielding plates, and a second shielding plate assembly including a plurality of second shielding plates.

Each of the plurality of first shielding plates and each of the plurality of second shielding plates may extend along a second direction that is substantially perpendicular to the first direction, and may partition the space between the deposition source nozzle unit and the patterning slit sheet into the plurality of deposition spaces.

The plurality of deposition source nozzles may be formed at the deposition source nozzle unit along a first direction, and the plurality of patterning slits may be formed along a second direction that is substantially perpendicular to the first direction.

The deposition source, the deposition source nozzle unit, and the patterning slit sheet may be integrally combined by using connection members.

The connection members may guide a flow path of the deposition material.

The connection members may seal spaces among the deposition source, the deposition source nozzle unit, and the patterning slit sheet from the outside.

According to another embodiment of the present invention, there is provided an organic layer deposition apparatus including a plurality of organic layer deposition assemblies for depositing deposition materials on a substrate, each of the plurality of organic layer deposition assemblies including a deposition source for discharging a deposition material of the deposition materials; a deposition source nozzle unit disposed at a side of the deposition source, and including a plurality of deposition source nozzles; and a plurality of patterning slit sheets disposed while facing the deposition source nozzle unit, and including a plurality of patterning slits and one or more alignment confirmation pattern slits that are formed at edge portions of the plurality of patterning slits, wherein the deposition material that is discharged from the deposition source passes through the plurality of patterning slit sheets and then is formed on the substrate, while a deposition process is performed.

In one embodiment, when the plurality of patterning slit sheets are aligned with respect to the substrate so as to deposit the deposition material on the substrate, the one or more alignment confirmation pattern slits, which are formed at the plurality of patterning slit sheets, respectively, do not overlap with each other.

While the substrate sequentially passes through the plurality of organic layer deposition assemblies, different deposition materials may be deposited on the substrate via the plurality of patterning slit sheets, respectively, and alignment confirmation patterns may be formed on the substrate via the one or more alignment confirmation pattern slits formed at the plurality of patterning slit sheets, respectively.

The organic layer deposition apparatus may further include a conveyer unit including a transfer unit configured to fix the substrate thereto and to move along with the substrate, a first conveyer unit for moving in a first direction the transfer unit on which the substrate is fixed, and a second conveyer unit for moving in a direction opposite to the first direction the transfer unit from which the substrate is separated after deposition has been completed; a loading unit for fixing the substrate on the transfer unit; a chamber maintained in a vacuum state and in which the plurality of organic layer deposition assemblies are disposed; and an unloading unit for separating, from the transfer unit, the substrate on which the deposition has been completed while passing through the plurality of organic layer deposition assemblies, wherein the transfer unit is configured to cyclically move between the first conveyer unit and the second conveyer unit, and wherein the substrate fixed on the transfer unit is configured to be spaced apart from the plurality of organic layer deposition assemblies by a set distance while being transferred by the first conveyer unit.

The first conveyer unit and the second conveyer unit may pass through the plurality of organic layer deposition assemblies in the chamber.

The first conveyer unit and the second conveyer unit may be arranged above and below each other.

The first conveyer unit may sequentially convey the transfer unit to the loading unit, the chamber, and the unloading unit.

The second conveyer unit may sequentially convey the transfer unit to the unloading unit, the chamber, and the loading unit.

According to another embodiment of the present invention, there is provided a method of manufacturing an organic light-emitting display apparatus by using an organic layer deposition apparatus including a plurality of organic layer deposition assemblies for depositing deposition materials on a substrate, each of the plurality of organic layer deposition assemblies including a deposition source for discharging a deposition material of the deposition materials; a deposition source nozzle unit disposed at a side of the deposition source, and including a plurality of deposition source nozzles; and a plurality of patterning slit sheets disposed while facing the deposition source nozzle unit, and including a plurality of patterning slits and one or more alignment confirmation pattern slits that are formed at edge portions of the plurality of patterning slits, wherein the deposition material that is discharged from the deposition source passes through the plurality of patterning slit sheets and then is formed on the substrate, whereby a deposition process is performed, wherein the organic light-emitting display apparatus includes a plurality of thin films that include a first electrode, an intermediate layer including an organic emission layer (organic EML), and a second electrode, and wherein, when at least one organic layer of the organic light-emitting display apparatus is formed, the method including operations of forming the at least one organic layer by using the organic layer deposition apparatus; and forming alignment confirmation patterns on the substrate via the one or more alignment confirmation pattern slits when the at least one organic layer is formed.

The at least one organic layer that is formed by using the organic layer deposition apparatus may be one of layers included in the intermediate layer.

While the substrate sequentially passes through the plurality of organic layer deposition assemblies, different deposition materials may be deposited on the substrate via the plurality of patterning slit sheets, respectively, and the alignment confirmation patterns may be formed on the substrate via the one or more alignment confirmation pattern slits formed at the plurality of patterning slit sheets, respectively.

The operation of forming the at least one organic layer may include operations of fixing the substrate to a transfer unit by using a loading unit; moving the transfer unit on which the substrate is fixed to a chamber, by using a first conveyer unit mounted to pass through the chamber; when the plurality of organic layer deposition assemblies are formed in the chamber, and the substrate and the plurality of organic layer deposition assemblies in the chamber are spaced apart by a set distance, forming the at least one organic layer in a manner that, while the substrate relatively moves with respect to the plurality of organic layer deposition assemblies, deposition materials discharged from the plurality of organic layer deposition assemblies are deposited on the substrate; separating, from the transfer unit, the substrate on which the deposition has been completed, by using an unloading unit; and moving the transfer unit, from which the substrate is separated, to the loading unit by using a second conveyer unit mounted to pass through the chamber.

While the substrate passes through the plurality of organic layer deposition assemblies, the deposition may be sequentially performed on the substrate.

According to another embodiment of the present invention, there is provided an organic light-emitting display apparatus formed by using an organic layer deposition apparatus, the organic light-emitting display apparatus including a substrate on which a display area and a non-display area are partitioned; a plurality of organic layer alignment confirmation patterns disposed in the non-display area, and formed by using the organic layer deposition apparatus; a first electrode formed in the display area; an intermediate layer including at least one organic layer formed on the first electrode and including an organic emission layer (organic EML); and a second electrode formed on the intermediate layer, wherein the at least one organic layer included in the intermediate layer on the substrate is formed by using the organic layer deposition apparatus, and is a linear pattern.

In each of the organic layers that are formed on the substrate by using the organic layer deposition apparatus and that are formed farther from the center of the deposition region, a slanted side (hypotenuse) farther from the center of the deposition region may be larger than the other slanted side (hypotenuse).

Slanted sides (hypotenuses) of the organic layer that is formed on the substrate by using the organic layer deposition apparatus and that is disposed at the center of the deposition region may have substantially the same length.

The organic layers that are formed on the substrate by using the organic layer deposition apparatus may be symmetrically arranged with respect to the center of the deposition region.

The substrate may have a size of 40 inches or more.

The organic layers formed by using the organic layer deposition apparatus may include the organic EML.

The organic layers formed by using the organic layer deposition apparatus may include an auxiliary emission layer.

The organic layers formed by using the organic layer deposition apparatus may have a non-uniform thickness.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, the present invention will be described in more detail by explaining exemplary embodiments of the invention with reference to the attached drawings.

Figure 1:
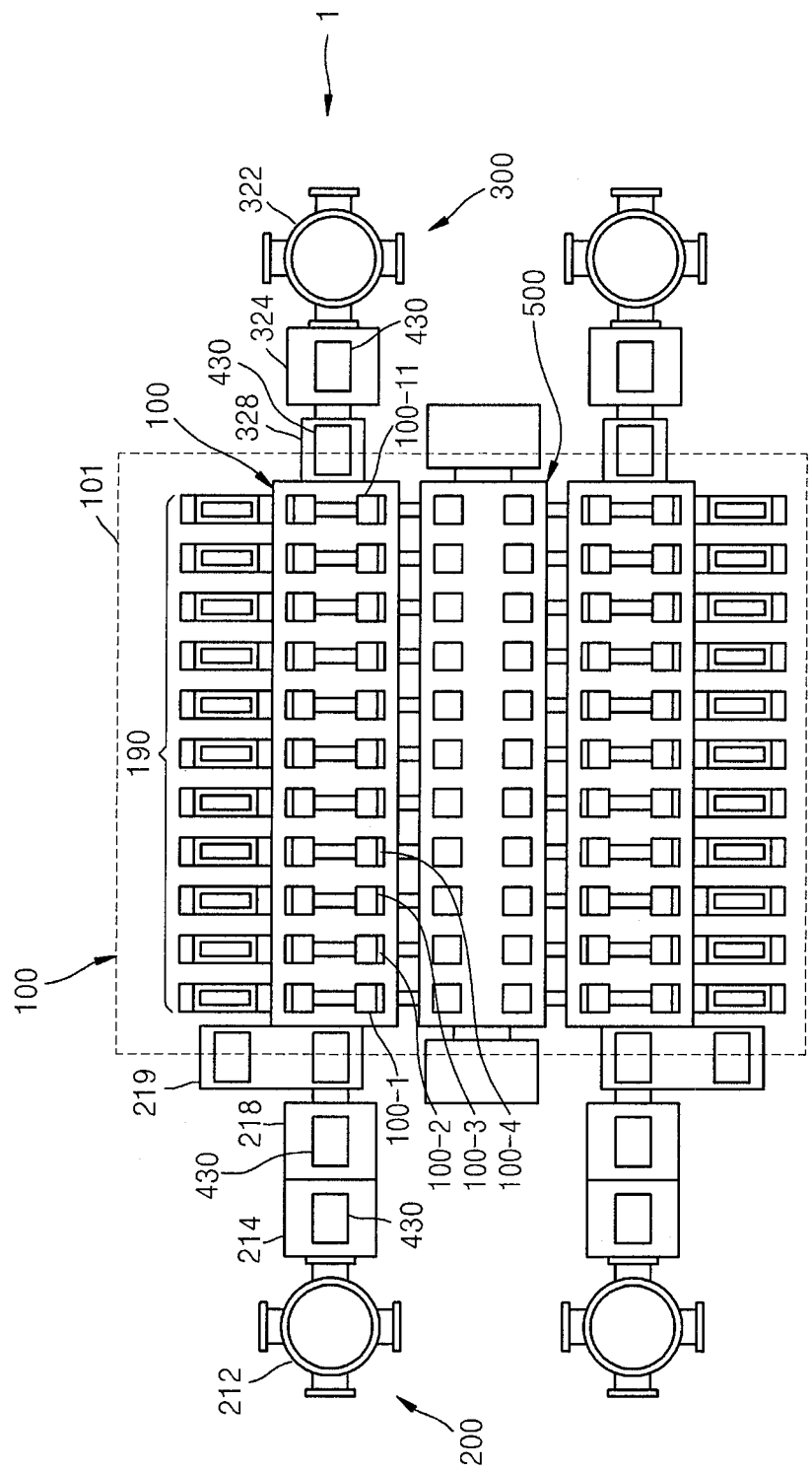
FIG. 1 is a schematic plan view illustrating a structure of a plurality of organic layer deposition assemblies and an organic layer deposition apparatus including the organic layer deposition assemblies according to an embodiment of the present invention.
Figure 2:
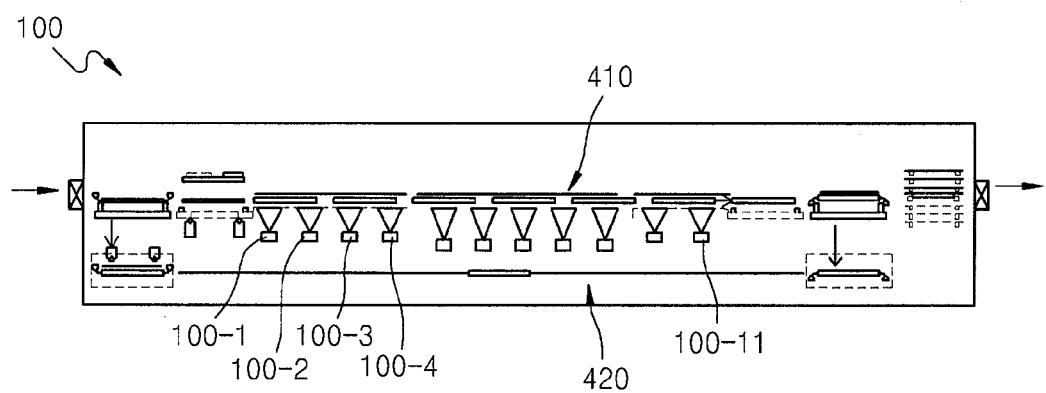
FIG. 2 is a schematic side view illustrating the organic layer deposition assemblies of the organic layer deposition apparatus of FIG. 1.
Figure 3:
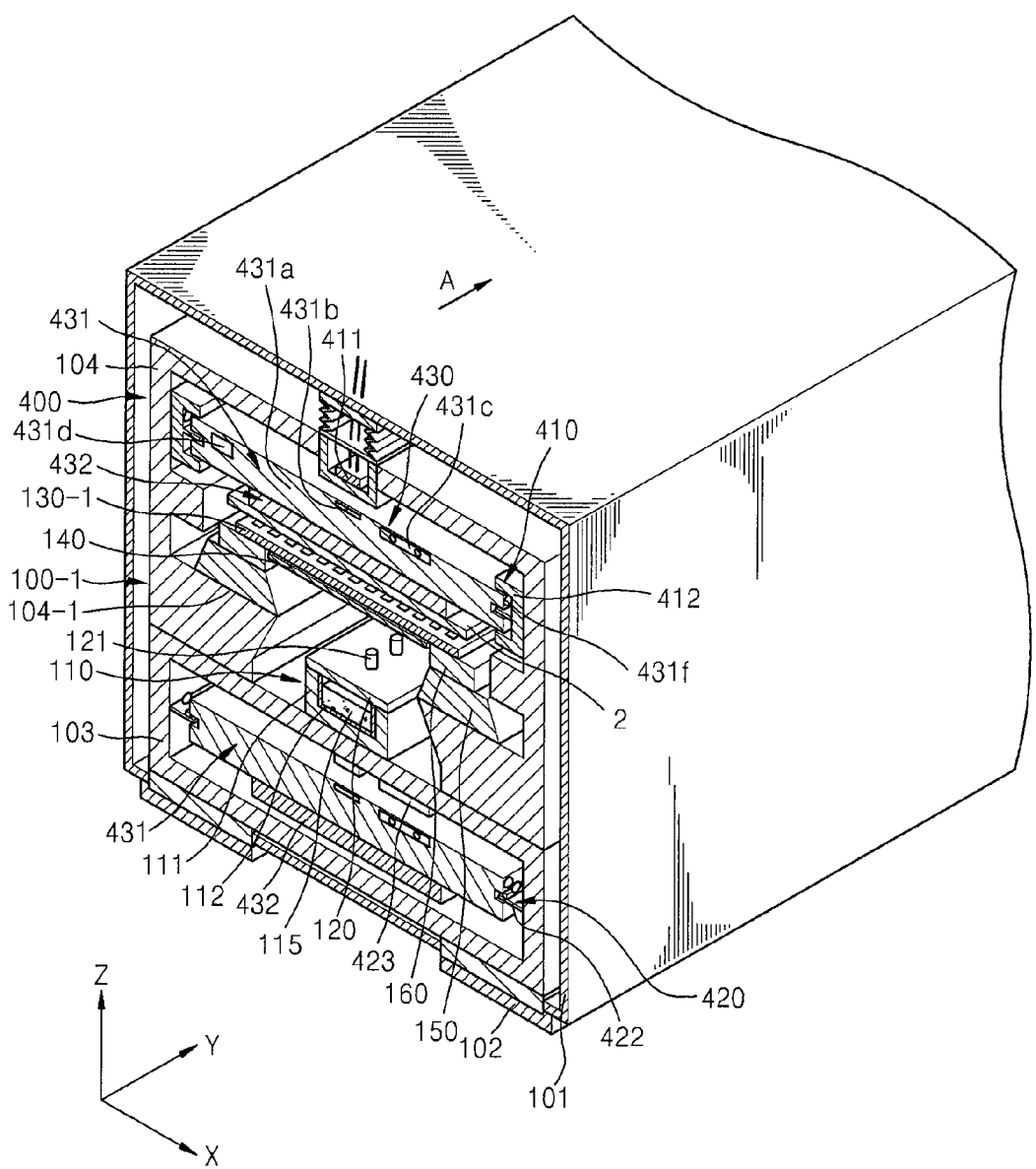
FIG. 3 is a schematic perspective view illustrating the organic layer deposition assembly of the organic layer deposition apparatus of FIG. 1.
Figure 4:
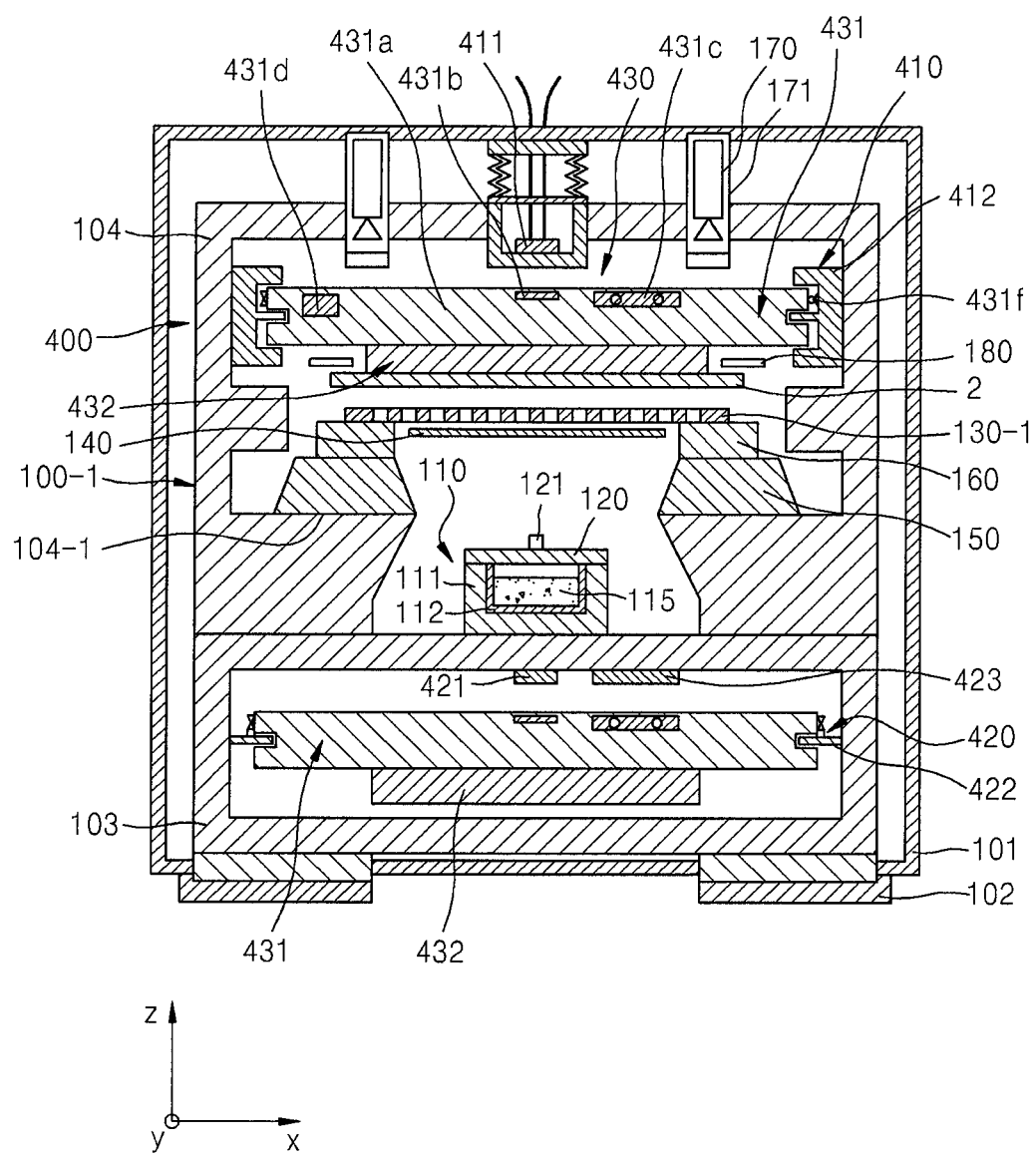
FIG. 4 is a schematic cross-sectional view illustrating the organic layer deposition assembly of FIG. 3.

FIG. 1 is a schematic plan view illustrating a structure of a plurality of organic layer deposition assemblies 100-1 through 100-11 and an organic layer deposition apparatus 1 including the organic layer deposition assemblies 100-1 through 100-11 according to an embodiment of the present invention. FIG. 2 is a schematic side view illustrating the organic layer deposition assemblies 100-1 through 100-11 of the organic layer deposition apparatus 1 of FIG. 1. FIG. 3 is a schematic perspective view illustrating the organic layer deposition assembly 100-1 of the organic layer deposition apparatus 1 of FIG. 1. FIG. 4 is a schematic cross-sectional view illustrating the organic layer deposition assembly 100-1 of FIG. 3.

Referring to FIGS. 1 through 4, the organic layer deposition apparatus 1 includes the organic layer deposition assemblies 100-1 through 100-11. That is, the organic layer deposition apparatus 1 includes the organic layer deposition assembly 100-1, the organic layer deposition assembly 100-2, the organic layer deposition assembly 100-3, and the organic layer deposition assemblies 100-4 through 100-11 which are sequentially disposed. Although not illustrated, the number of organic layer deposition assemblies in the organic layer deposition apparatus 1 may vary.

Also, the organic layer deposition apparatus 1 includes a deposition unit 100, a loading unit 200, an unloading unit 300, and a conveyer unit 400 (refer to FIGS. 3 and 4).

The loading unit 200 may include a first rack 212, a transport chamber 214, a first inversion chamber 218, and a buffer chamber 219.

A plurality of substrates 2 (refer to FIGS. 3 and 4) onto which a deposition material has not yet been applied are stacked up on the first rack 212. A transport robot included in the transport chamber 214 picks up one of the substrates 2 from the first rack 212, disposes it on a transfer unit 430 transferred by a second conveyer unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber 101 for deposition. In the chamber 101, the organic layer deposition assemblies 100-1, 100-2, . . . , 100-n are disposed. Referring to FIG. 1, 11 organic layer deposition assemblies, i.e., a first organic layer deposition assembly 100-1, a second organic layer deposition assembly 100-2, . . . , an eleventh organic layer deposition assembly 100-11, are disposed in the chamber 101, but the number of organic layer deposition assemblies may vary with a desired deposition material and deposition conditions. The chamber 101 is maintained in vacuum during the deposition process.

The transfer unit 430 with the substrate 2 fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when the transfer unit 430 passes through the deposition unit 100, and the second conveyer unit 420 conveys the transfer unit 430 from which the substrate 2 is separated.

The organic layer deposition apparatus 1 is configured in such a manner that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

The deposition unit 100 may further include a deposition source replacement unit 190 disposed at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 1 illustrates the organic layer deposition apparatus 1 in which two sets of structures each including the loading unit 200, the deposition unit 100, the unloading unit 300, and the conveyer unit 400 are arranged in parallel. That is, it can be seen that two organic layer deposition apparatuses 1 are respectively arranged at one side and another side of the organic deposition apparatus 1 (above and below in FIG. 1). In such an embodiment, a patterning slit sheet replacement unit 500 may be disposed between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes the patterning slit sheet replacement unit 500.

Referring to FIGS. 3 and 4, the deposition unit 100 of the organic layer deposition apparatus 1 according to the present embodiment includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the conveyer unit 400. In another descriptive manner, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The organic layer deposition assembly 100-1 and the first conveyer unit 410 of the conveyer unit 400 are disposed in the upper housing 104, and the second conveyer unit 420 of the conveyer unit 400 is disposed in the lower housing 103. While the transfer unit 430 is cyclically moving between the first conveyer unit 410 and the second conveyer unit 420, a deposition process may be continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, an image-capturing member 170, and a sensor 180. In this regard, all the elements illustrated in FIGS. 3 and 4 may be arranged in the chamber 101 maintained in an appropriate vacuum state. This structure is needed to achieve the linearity of a deposition material.

In particular, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method of an FMM. In addition, the temperature of the patterning slit sheet 130 should be sufficiently lower than that of the deposition source 110 because thermal expansion of the patterning slit sheet 130 is minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass having a size of 40 inches or more, for manufacturing a plurality of flat panel displays, may be used as the substrate 2.

According to the present embodiment, the deposition process may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

To solve these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a conventional deposition method. In addition, this is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side in which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that vaporizes the deposition material 115.

The deposition source nozzle unit 120 is disposed at a side of the deposition source 110 facing the substrate 2. Here, in the organic layer deposition assembly 100-1, deposition source nozzles may be differently formed for deposition to form a common layer and a pattern layer. That is, in the deposition source nozzle unit 120, to form the pattern layer, a plurality of deposition source nozzles 121 may be formed in the Y-axis direction, i.e., a scanning direction of the substrate 2. Thus, in the present embodiment, the deposition source nozzles 121 are formed such that only one line of the deposition source nozzles 121 is formed in the X-axis direction, to significantly reduce the occurrence of shadows. On the other hand, although not illustrated, in the deposition source nozzle unit 120, to form the common layer, the deposition source nozzles 121 may be formed in the X-axis direction. By doing so, a thickness uniformity of the common layer may be improved.

The patterning slit sheet 130 is disposed between the deposition source 110 and the substrate 2. The patterning slit sheet 130 may be attached to a frame (not shown) having a shape similar to a window frame.

The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

The patterning slit sheet 130 includes an alignment confirmation pattern slit 135. FIGS. 5A through 5D illustrate alignment confirmation pattern slits 135A through 135D with respect to a plurality of patterning slit sheets 130-1 through 130-4.

Figure 5A:
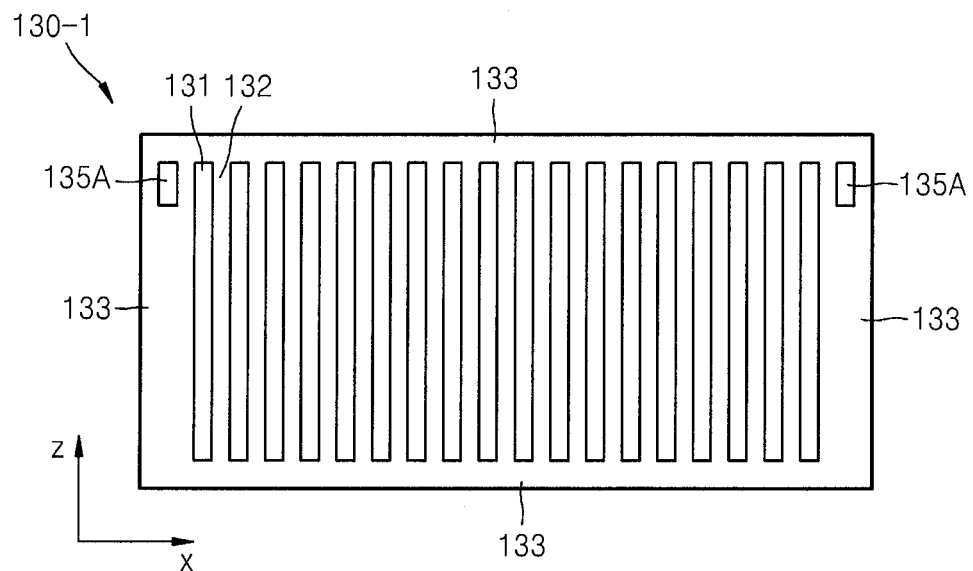
FIGS. 5A through 5D illustrate alignment confirmation pattern slits with respect to a plurality of patterning slit sheets.

FIG. 5A illustrates the patterning slit sheet 130-1 of the organic layer deposition assembly 100-1. The patterning slit sheet 130-1 includes a plurality of patterning slits 131. An intermediate region 132 that does not allow a deposition material to pass therethrough is formed between each of the adjacent patterning slits 131, and an outer region 133 surrounds the patterning slits 131 in the outside of the patterning slits 131. That is, the outer region 133 is formed at each of lower, upper, left, and right sides with respect to the patterning slits 131 of the patterning slit sheet 130-1. The alignment confirmation pattern slit 135A is formed in the outer region 133. In more detail, the alignment confirmation pattern slit 135A is formed in each of the outer regions 133 at the left and right sides of the patterning slits 131. Although not illustrated, the number of the alignment confirmation pattern slit 135A may be one or may be at least three. Also, the alignment confirmation pattern slit 135A may be formed in the outer region 133 at the upper or lower side of the patterning slits 131.

Figure 5B:
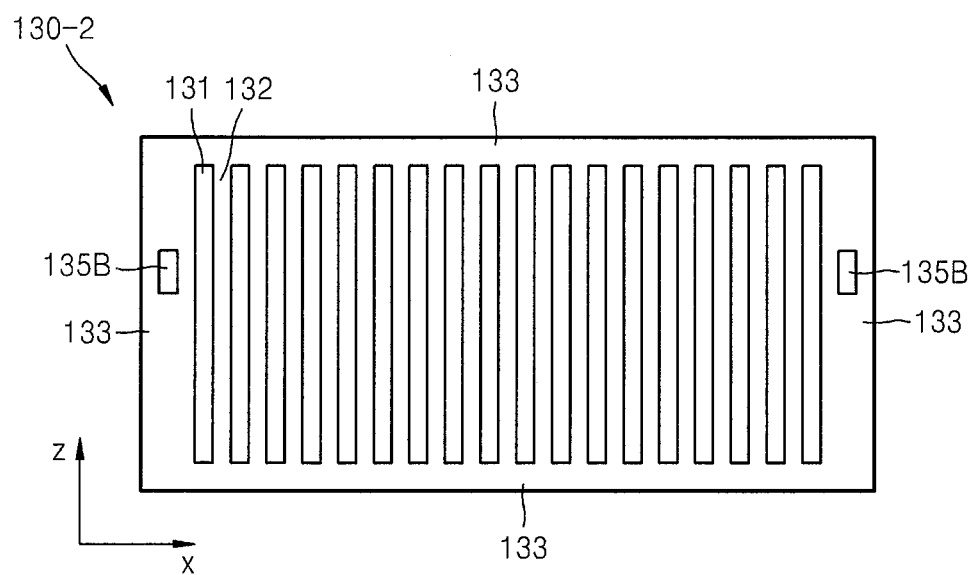

FIG. 5B illustrates the patterning slit sheet 130-2 of the organic layer deposition assembly 100-2. The patterning slit sheet 130-2 includes a plurality of patterning slits 131. An intermediate region 132 is formed between each of the adjacent patterning slits 131, and an outer region 133 surrounds the patterning slits 131 in the outside of the patterning slits 131. That is, the outer region 133 is formed at each of lower, upper, left, and right sides with respect to the patterning slits 131 of the patterning slit sheet 130-2. The alignment confirmation pattern slit 135B is formed in the outer region 133. In more detail, the alignment confirmation pattern slit 135B is formed in each of the outer regions 133 at the left and right sides of the patterning slits 131. Although not illustrated, the number of the alignment confirmation pattern slit 135B may be one or may be at least three. Also, the alignment confirmation pattern slit 135B may be formed in the outer region 133 at the upper or lower side of the patterning slits 131.

In particular, the alignment confirmation pattern slit 135B does not overlap with the alignment confirmation pattern slit 135A of the patterning slit sheet 130-1. That is, when a deposition process is performed while the substrate 2 sequentially passes through the organic layer deposition assembly 100-1 and the organic layer deposition assembly 100-2, a deposition pattern formed via the alignment confirmation pattern slit 135A and a deposition pattern formed via the alignment confirmation pattern slit 135B do not overlap with each other on the substrate 2 in a normal alignment status.

Figure 5C:
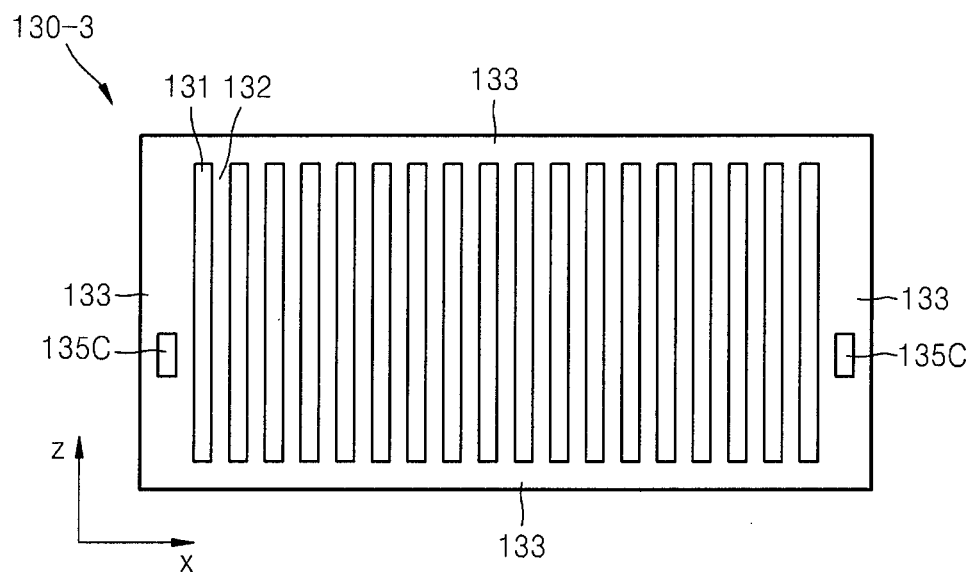

FIG. 5C illustrates the patterning slit sheet 130-3 of the organic layer deposition assembly 100-3. The patterning slit sheet 130-3 includes a plurality of patterning slits 131. An intermediate region 132 is formed between each of the adjacent patterning slits 131, and an outer region 133 surrounds the patterning slits 131 in the outside of the patterning slits 131. That is, the outer region 133 is formed at each of lower, upper, left, and right sides with respect to the patterning slits 131 of the patterning slit sheet 130-3. The alignment confirmation pattern slit 135C is formed in the outer region 133. In more detail, the alignment confirmation pattern slit 135C is formed in each of the outer regions 133 at the left and right sides of the patterning slits 131. Although not illustrated, the number of the alignment confirmation pattern slit 135C may be one or may be at least three. Also, the alignment confirmation pattern slit 135C may be formed in the outer region 133 at the upper or lower side of the patterning slits 131.

In particular, the alignment confirmation pattern slit 135C does not overlap with the alignment confirmation pattern slit 135A of the patterning slit sheet 130-1 and the alignment confirmation pattern slit 135B of the patterning slit sheet 130-2. That is, when a deposition process is performed while the substrate 2 sequentially passes through the organic layer deposition assembly 100-1, the organic layer deposition assembly 100-2, and the organic layer deposition assembly 100-3, a deposition pattern formed via the alignment confirmation pattern slit 135A, a deposition pattern formed via the alignment confirmation pattern slit 135B, and a deposition pattern formed via the alignment confirmation pattern slit 135C do not overlap with each other on the substrate 2 in a normal alignment status.

Figure 5D:
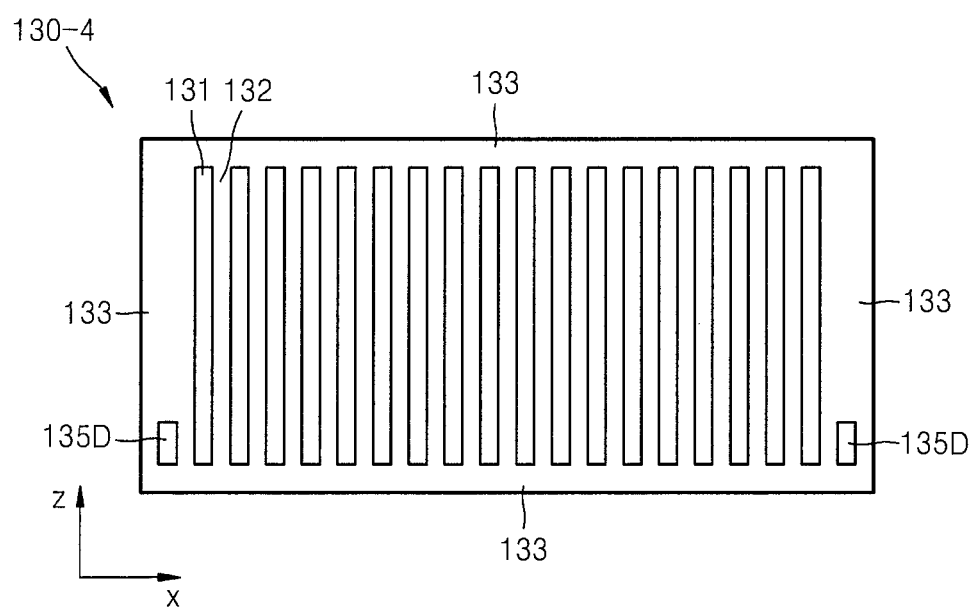

FIG. 5D illustrates the patterning slit sheet 130-4 of the organic layer deposition assembly 100-4. The patterning slit sheet 130-4 includes a plurality of patterning slits 131. An intermediate region 132 is formed between each of the adjacent patterning slits 131, and an outer region 133 surrounds the patterning slits 131 in the outside of the patterning slits 131. That is, the outer region 133 is formed at each of lower, upper, left, and right sides with respect to the patterning slits 131 of the patterning slit sheet 130-4. The alignment confirmation pattern slit 135D is formed in the outer region 133. In more detail, the alignment confirmation pattern slit 135D is formed in each of the outer regions 133 at the left and right sides of the patterning slits 131. Although not illustrated, the number of the alignment confirmation pattern slit 135D may be one or may be at least three. Also, the alignment confirmation pattern slit 135D may be formed in the outer region 133 at the upper or lower side of the patterning slits 131.

In particular, the alignment confirmation pattern slit 135D does not overlap with the alignment confirmation pattern slit 135A of the patterning slit sheet 130-1, the alignment confirmation pattern slit 135B of the patterning slit sheet 130-2, and the alignment confirmation pattern slit 135C of the patterning slit sheet 130-3. That is, when a deposition process is performed while the substrate 2 sequentially passes through the organic layer deposition assembly 100-1, the organic layer deposition assembly 100-2, the organic layer deposition assembly 100-3, and the organic layer deposition assembly 100-4, a deposition pattern formed via the alignment confirmation pattern slit 135A, a deposition pattern formed via the alignment confirmation pattern slit 135B, a deposition pattern formed via the alignment confirmation pattern slit 135C, and a deposition pattern formed via the alignment confirmation pattern slit 135D do not overlap with each other on the substrate 2 in a normal alignment status.

In the present embodiment, a deposition process is performed while the substrate 2 and the organic layer deposition assemblies 100-1 through 100-11 move with respect to each other, so that it is required for the substrate 2 and the patterning slit sheet 130 to be exactly aligned with respect to each other. In particular, when each of the organic layer deposition assemblies 100-1 through 100-11 deposits at least two different organic layers, it is required for the substrate 2 and the patterning slit sheet 130 of each of the organic layer deposition assemblies 100-1 through 100-11 to be exactly aligned with respect to each other. In the present embodiment, the alignment confirmation pattern slit 135A is formed in the patterning slit sheet 130-1, so that an alignment pattern for a check of alignment between the substrate 2 and the patterning slit sheet 130 is formed in a region other than a region of the substrate 2 to which the deposition process is actually performed.

By doing so, after the deposition process is performed while the substrate 2 passes through the organic layer deposition assemblies 100-1 through 100-4, it is possible to check an alignment status between the patterning slit sheets 130-1 through 130-4 and the substrate 2, and then after the alignment status is checked and positions of the patterning slit sheets 130-1 through 130-4 are corrected, a deposition process may then be accurately performed on the substrate 2.

The deposition source 110 (and the deposition source nozzle unit 120 that is coupled with the deposition source 110), and the patterning slit sheet 130 may be separated from each other by a set or predetermined distance.

As described above, the organic layer deposition assembly 100-1 performs deposition while relatively moving with respect to the substrate 2, and in order to allow the organic layer deposition assembly 100-1 to relatively move with respect to the substrate 2, the patterning slit sheet 130 is separated from the substrate 2 by a set or predetermined distance.

In more detail, according to the conventional deposition method using the FMM, a deposition process is performed while a mask is adhered to a substrate so as to prevent occurrence of a shadow on the substrate. However, when the mask is adhered to the substrate, a defect may be incurred due to a contact between the substrate and the mask. Also, since the mask cannot move with respect to the substrate, a size of the mask has to be equal to a size of the substrate. However, when a display apparatus becomes large, the size of the mask has to be increased, but it is difficult to form such a large mask.

To solve the aforementioned problem, in the organic layer deposition assembly 100-1 according to the present embodiment, the patterning slit sheet 130 is separated from the substrate 2, which is a deposition target, by a set predetermined distance. That is, the deposition process is performed while the patterning slit sheet 130 that is smaller than the substrate 2 moves with respect to the substrate 2, so that it becomes easy to manufacture the patterning slit sheet 130, is possible to fundamentally prevent a defect due to a contact between the substrate 2 and the patterning slit sheet 130, and is not required to arrange a time to adhere the substrate 2 and the patterning slit sheet 130, so that the manufacturing speed may be improved.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 110 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

Here, as described above, it is possible to check patterns of the deposition material on the substrate 2 and to exactly align the patterning slit sheet 130 on a desired position, by using the alignment confirmation pattern slits 135A through 135D.

Also, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be disposed between the patterning slit sheet 130 and the deposition source 110. In particular, an electrode pattern is formed on an edge portion of the substrate 2 and is used as a terminal for inspecting a product or in manufacturing a product. If an organic material is applied on a region of the substrate 2, the electrode pattern cannot normally operate. Thus, the edge portion of the substrate 2 has to be formed as a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

In the present embodiment, to prevent the organic material from being deposited on the non-film-forming region of the substrate 2, the shielding member 140 may be further disposed on the edge portion of the substrate 2. Although not illustrated, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be easy to prevent the organic material from being deposited on the non-film-forming region of the substrate 2 without using a separate structure.

Hereinafter, the conveyer unit 400 that conveys the substrate 2, on which the deposition material 115 is to be deposited, is described in more detail. Referring to FIGS. 3 and 4, the conveyer unit 400 includes the first conveyer unit 410, the second conveyer unit 420, and the transfer unit 430.

The first conveyer unit 410 conveys in an in-line manner the carrier 431, the transfer unit 430 including an electrostatic chuck 432 attached to the carrier 431, and the substrate 2 attached to the transfer unit 430, so that an organic layer may be formed on the substrate 2 by the organic layer deposition assembly 100-1. The first conveyer unit 410 includes a coil 411, guide members 412, upper magnetically suspended bearings (not shown), side magnetically suspended bearings (not shown), and gap sensors (not shown).

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

First, the carrier 431 of the transfer unit 430 will now be described in more detail.

The carrier 431 includes a main body part 431a, a magnetic rail 431b, a contactless power supply (CPS) module 431c, and a power supply unit 431d.

The main body part 431a constitutes a base part of the carrier 431 and may be formed of a magnetic material such as iron. In this regard, due to a repulsive force between the main body part 431a and the respective upper and side magnetically suspended bearings (not shown), which are described below, the carrier 431 may be maintained spaced apart from the guide members 412 by a certain distance.

As illustrated, set or predetermined guide grooves may be respectively formed at both sides of the main body part 431a and each may accommodate a guide protrusion of the guide member 412. The magnetic rail 431b may be formed along a center line of the main body part 431a in a direction where the main body part 431*a* proceeds. The magnetic rail 431*b* and the coil 411, which are described below in more detail, may be combined with each other to constitute a linear motor, and the carrier 431 may be conveyed in an arrow direction A by the linear motor.

The CPS modules 431*c* and the power supply unit 431*d* may be respectively formed on both sides of the magnetic rail 431*b* in the main body part 431*a*. The power supply unit 431*d* includes a battery (e.g., a rechargeable battery) that provides power so that the electrostatic chuck 432 can chuck the substrate 2 and maintains operation. The CPS modules 431*c* are wireless charging modules that charge the power supply unit 431*d*. In particular, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431*c* so as to supply power to the CPS module 431*c*. The power supplied to the CPS modules 431*c* is used to charge the power supply unit 431*d*.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the transfer unit 430 is described in more detail.

The magnetic rail 431*b* of the main body part 431*a* and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the magnetic rail 431*b*. The magnetic rail 431*b* is linearly disposed on the carrier 431, and a plurality of the coils 411 may be disposed at an inner side of the chamber 101 by a certain distance so as to face the magnetic rail 431*b*. Since the magnetic rail 431*b* is disposed on the carrier 431 instead of the coil 411, the carrier 431 may be operable without power being supplied thereto.

In this regard, the coil 411 may be formed in an atmosphere (ATM) box in an atmospheric state, and the magnetic rail 431*b* is attached to the carrier 431, so that the carrier 431 may be moved in the chamber 101 maintained in vacuum.

Hereinafter, the first conveyer unit 410 and the transfer unit 430 are described in more detail.

The first conveyer unit 410 conveys the electrostatic chuck 432 that fixes the substrate 2 and conveys the carrier 431 that conveys the electrostatic chuck 432.

The coil 411 and the guide members 412 are formed inside the upper housing 104. In more detail, the coil 411 is formed in an upper portion of the upper housing 104, and the guide members 412 are respectively formed on both inner sides of the upper housing 104. The guide members 412 guide the carrier 431 to move in a direction. In this regard, the guide members 412 are formed to pass through the deposition unit 100.

The side magnetically suspended bearings (not shown) are each disposed in the guide member 412 so as to respectively correspond to both sides of the carrier 431. The side magnetically suspended bearings cause a distance between the carrier 431 and the guide member 412 so that the carrier 431 is moved along the guide members 412 in non-contact with the guide members 412.

Each upper magnetically suspended bearing (not shown) may be disposed in the guide members 412 so as to be above the carrier 431. The upper magnetically suspended bearings enable the carrier 431 to be moved along the guide members 412 with a constant distance maintained therebetween.

Although not illustrated, the guide members 412 may further include gap sensors (not shown) so as to measure distances between the carrier 431 and the respective guide member 412. Also, gap sensors (not shown) may be disposed in the aforementioned upper and side magnetically suspended bearings. The distances between the carrier 431 and the respective guide members 412 may be adjusted in real time according to values measured by the gap sensors. That is, a precise transfer of the carrier 431 may be feedback controlled using the upper and side magnetically suspended bearings and the gap sensors.

Hereinafter, the second conveyer unit 420 and the transfer unit 430 are described in more detail.

The second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Although not illustrated, the coil 421 may be disposed in an ATM box, as the coil 411 of the first conveyer unit 410.

Like the first conveyer unit 410, the second conveyer unit 420 may include the coil 421. Also, the magnetic rail 431*b* of the main body part 431*a* of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100. As a result, the second conveyer unit 420 is used in a process of returning the carrier 431 from which the substrate 2 has been separated and not in a process of depositing an organic material on the substrate 2, and thus, position accuracy thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. Although not illustrated, the magnetic suspension may also be applied to the second conveyer unit 420 as in the first conveyer unit 410.

The organic layer deposition assembly 100-1 of the organic layer deposition apparatus 1 according to the present embodiment may further include the image-capturing member 170 and the sensor 180 for an aligning process. In more detail, the image-capturing member 170 may align in real time a first alignment mark (not shown) formed in a frame (not shown) combined with the patterning slit sheet 130-1, and a second alignment mark (not shown) formed on the substrate 2. In this regard, the image-capturing member 170 is disposed to more accurately view in the chamber 101 maintained in vacuum during deposition. For this, the image-capturing member 170 may be installed in a camera accommodation unit 171 in an atmospheric state.

In the present embodiment, since the substrate 2 and the patterning slit sheet 130 are spaced apart from each other by a certain distance, distances to the substrate 2 and the patterning slit sheet 130 that are disposed at different positions both need to be measured using the image-capturing member 170. For this operation, the organic layer deposition assembly 100-1 of the organic layer deposition apparatus 1 may include the sensor 180. In this regard, the sensor 180 may be a confocal sensor. The confocal sensor may scan an object to be measured by using laser beams that rotate at high speed by using a scanning mirror and measure a distance to the object by using fluorescent or reflected rays emitted by the laser beams. The confocal sensor may measure a distance by sensing a boundary interface between different media.

Since a distance between the substrate 2 and the patterning slit sheet 130 is measurable in real time using the image-capturing member 170 and the sensor 180, the substrate 2 may be aligned with the patterning slit sheet 130 in real time, whereby position accuracy of a pattern may be significantly improved.

In the organic layer deposition apparatus 1 including the organic layer deposition assemblies 100-1 through 100-11 according to the present embodiment, the deposition process is performed while the organic layer deposition assemblies 100-1 through 100-11 and the substrate 2 move with respect to each other. Accordingly, alignment between the substrate 2 and the respective patterning slit sheets 130-1 through 130-4 for deposition patterns is important. In particular, the organic layer deposition apparatus 1 may include the organic layer deposition assemblies 100-1 through 100-11, and at least some of the organic layer deposition assemblies 100-1 through 100-11 may deposit deposition layers having different patterns. Thus, the alignment between the substrate 2 and the respective patterning slit sheets 130-1 through 130-4 to form different deposition patterns affects a characteristic of a deposited layer. For example, when the different deposition patterns are formed in an undesired manner and thus overlap with each other, the characteristic of the deposited layer may significantly deteriorate. In the present embodiment, the alignment confirmation pattern slits 135A through 135D are formed in the patterning slit sheets 130-1 through 130-4 in the outer regions 133 of the patterning slits 131, so that it is easy to check the alignment between the substrate 2 and the respective patterning slit sheets 130-1 through 130-4 and is possible to correct the alignment when the alignment is not correct.

That is, when the deposition patterns are formed by using the patterning slits 131 while the substrate 2 sequentially passes through the organic layer deposition assemblies 100-1 through 100-11 in the organic layer deposition apparatus 1, the alignment between the substrate 2 and the respective patterning slit sheets 130-1 through 130-4 may be easily checked at a time prior to pattern deposition by using alignment confirmation patterns that are formed in the outside of the deposition patterns by using the alignment confirmation pattern slits 135A through 135D.

By doing so, the deposition process may be performed after checking and correcting a misaligned patterning slit from among the patterning slit sheets 130-1 through 130-4, so that the deposition patterns may be precisely formed on the deposited layer on the substrate 2, and as a result, the characteristic of the deposited layer may be improved.

Figure 6:
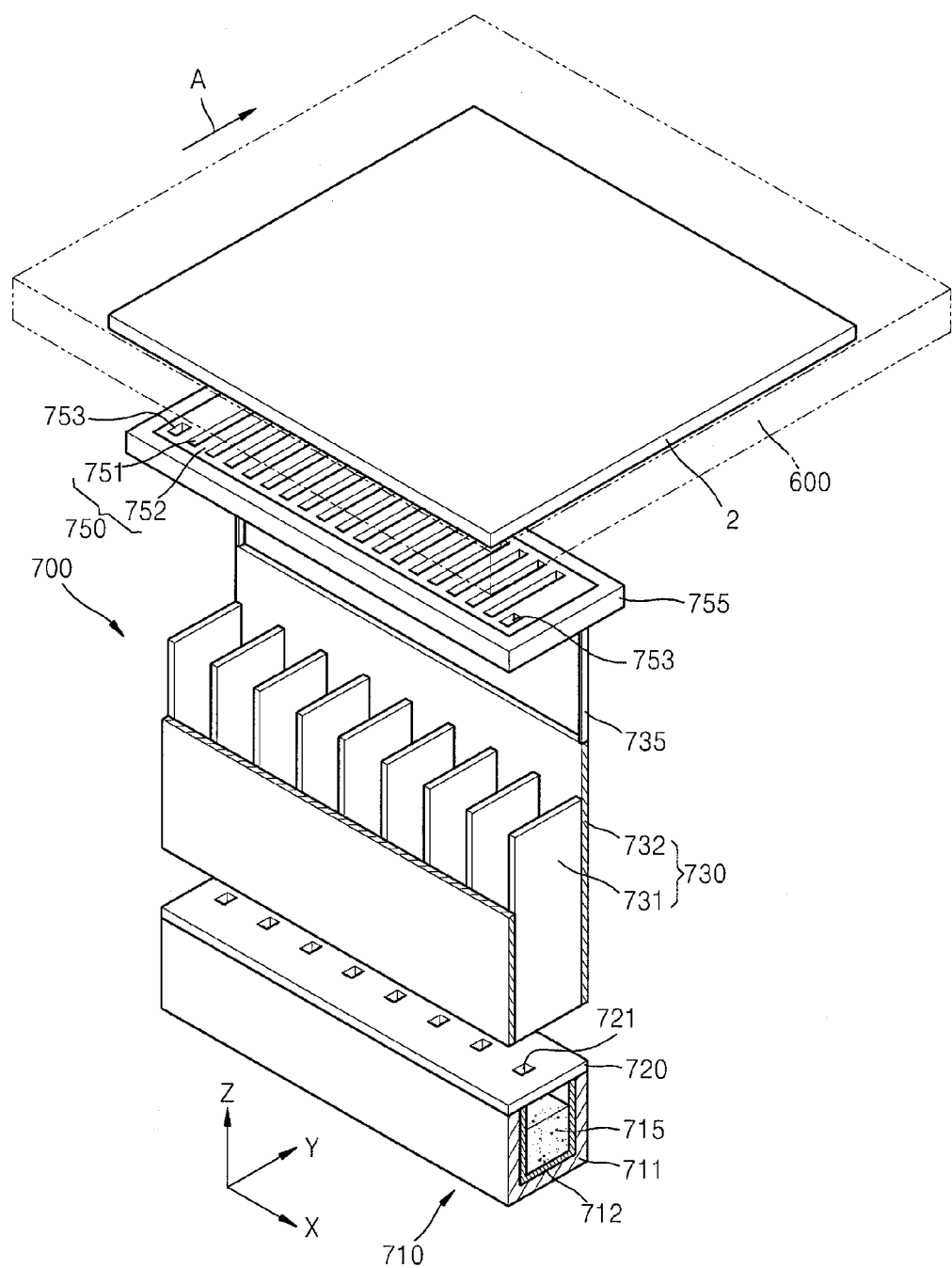
FIG. 6 is a schematic perspective view of an organic layer deposition assembly according to an embodiment of the present invention.
Figure 7:
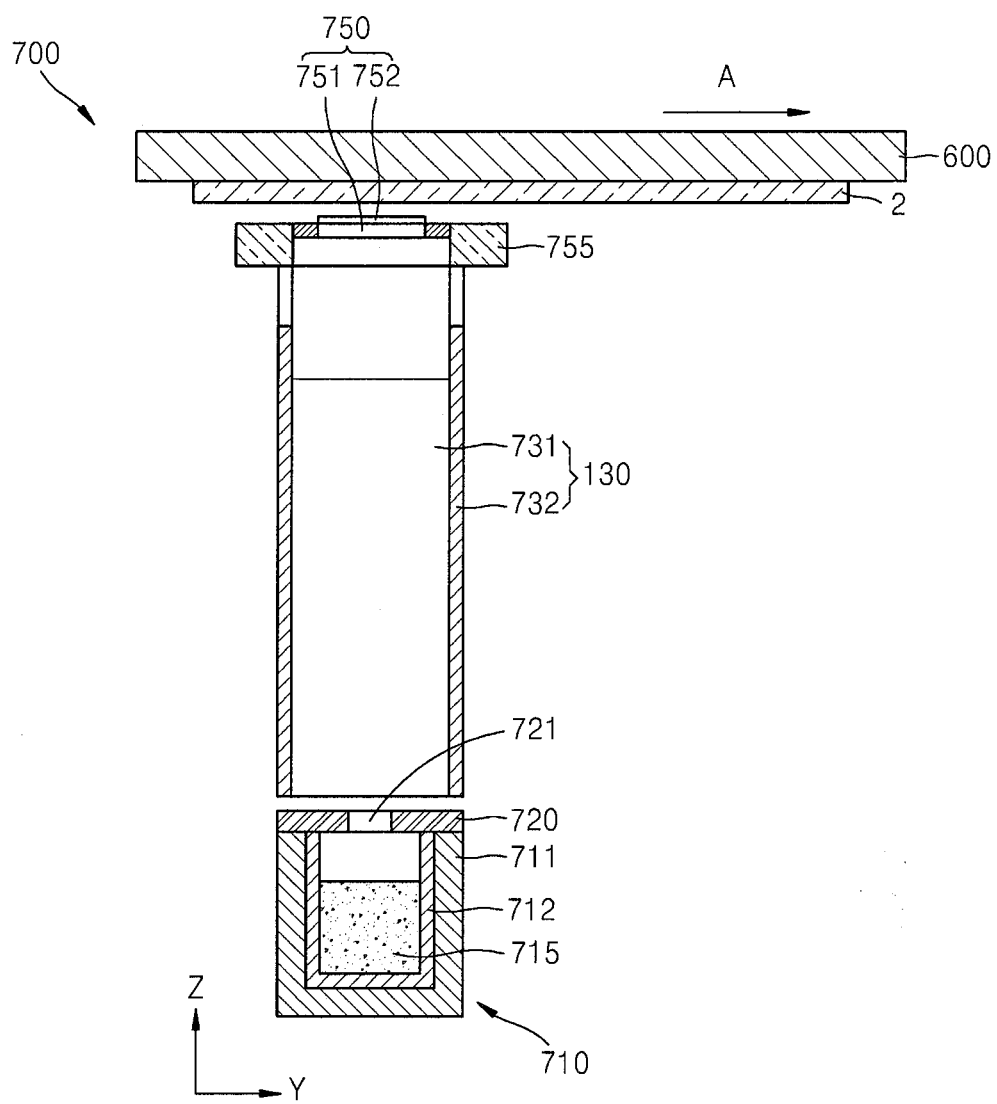
FIG. 7 is a cross-sectional side view of the organic layer deposition assembly of FIG. 6.
Figure 8:
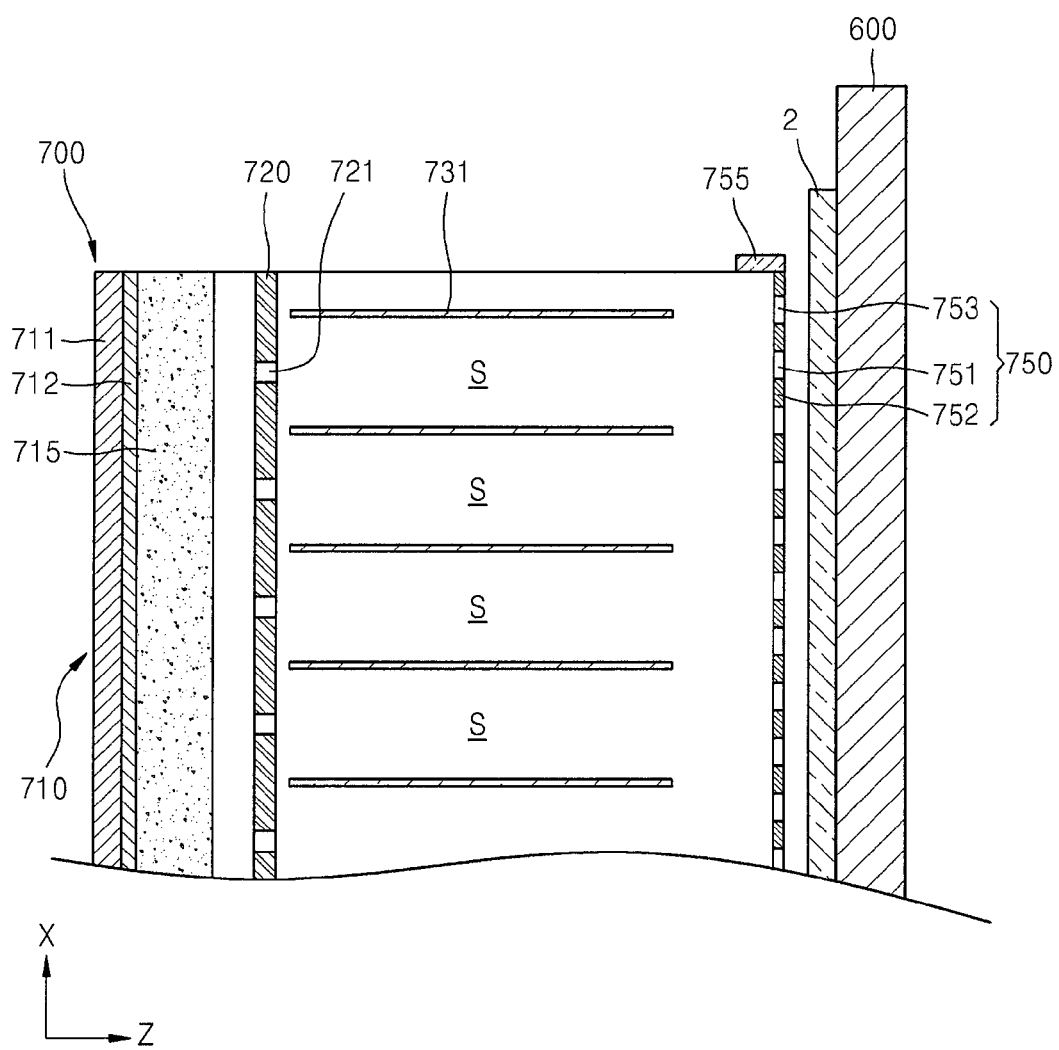
FIG. 8 is a cross-sectional plan view of the organic layer deposition assembly of FIG. 6.

FIG. 6 is a schematic perspective view of an organic layer deposition assembly 700 according to an embodiment of the present invention. FIG. 7 is a cross-sectional side view of the organic layer deposition assembly 700 of FIG. 6. FIG. 8 is a cross-sectional plan view of the organic layer deposition assembly 700 of FIG. 6. For convenience of description, the present embodiment is described in terms of features different from those of the previous embodiment.

Referring to FIGS. 6 through 8, the organic layer deposition assembly 700 includes a deposition source 710, a deposition source nozzle unit 720, a shielding plate assembly 730, and a patterning slit sheet 750.

The patterning slit sheet 750 is disposed between the deposition source 710 and a substrate 2. The patterning slit sheet 750 is combined with a frame 755 having a shape similar to a window frame. The patterning slit sheet 750 includes a plurality of patterning slits 751 arranged in an X-axis direction. An intermediate region 752 is formed between the adjacent patterning slits 751, and alignment confirmation pattern slits 753 are formed in the outside of the patterning slits 751.

The patterning slit sheet 750 is equal to the aforementioned patterning slit sheet 130 and thus detailed descriptions thereof are omitted here.

A deposition material 715 that has been vaporized in the deposition source 710 passes through the deposition source nozzle unit 720 and the patterning slit sheet 750 and then moves toward the substrate 2 that is a deposition target.

The deposition source 710 includes a crucible 711 that is filled with the deposition material 715 and a heater 712 that heats the crucible 711 so as to vaporize the deposition material 715 included in the crucible 711 toward the deposition source nozzle unit 720. The deposition source nozzle unit 720 is disposed at a side of the deposition source 710, and a plurality of deposition source nozzles 721 are formed on the deposition source nozzle unit 720 along the X-axis direction.

The shielding plate assembly 730 is arranged at a side of the deposition source nozzle unit 720. The shielding plate assembly 730 includes a plurality of shielding plates 731 and a shielding plate frame 732 disposed on an outer side of the shielding plates 731. The shielding plates 731 may be disposed in parallel to each other along the X-axis direction. Here, the shielding plates 731 may be disposed at regular intervals. Also, each of the shielding plates 731 may extend along Y-Z planes and may have a rectangular shape. The shielding plates 731 that are disposed in the aforementioned manner partition a space between the deposition source nozzle unit 720 and the patterning slit sheet 750 into a plurality of deposition spaces S as illustrated in FIG. 8, so that a deposition material that is exhausted from one deposition source nozzle 721 is not mixed with deposition materials that are exhausted from other deposition source nozzles 721, but passes through the patterning slit 751 and then is deposited onto the substrate 2. That is, each of the shielding plates 731 functions to guide a movement path of the deposition material, so that the deposition material exhausted from each of the deposition source nozzles 721 goes straight in a Z-axis direction without spreading.

As described above, a linearity of the deposition material is achieved by arrangement of the shielding plates 731, so that a size of shadows formed on the substrate 2 may be significantly reduced, and thus the organic layer deposition assembly 700 and the substrate 2 may be spaced apart from each other by a certain distance.

Also, a deposition process may proceed while the substrate 2 that is fixed onto an electrostatic chuck 600 moves with respect to the organic layer deposition assembly 700.

Although not illustrated, a plurality of the organic layer deposition assemblies 700 may be arranged, and a deposition process may proceed while the substrate 2 sequentially passes through the plurality of the organic layer deposition assemblies 700. Also, as in the aforementioned embodiment, the patterning slit sheet 750 of each of the organic layer deposition assemblies 700 in an organic layer deposition apparatus may include the alignment confirmation pattern slits 753 that are disposed while not overlapping with each other.

Figure 9:
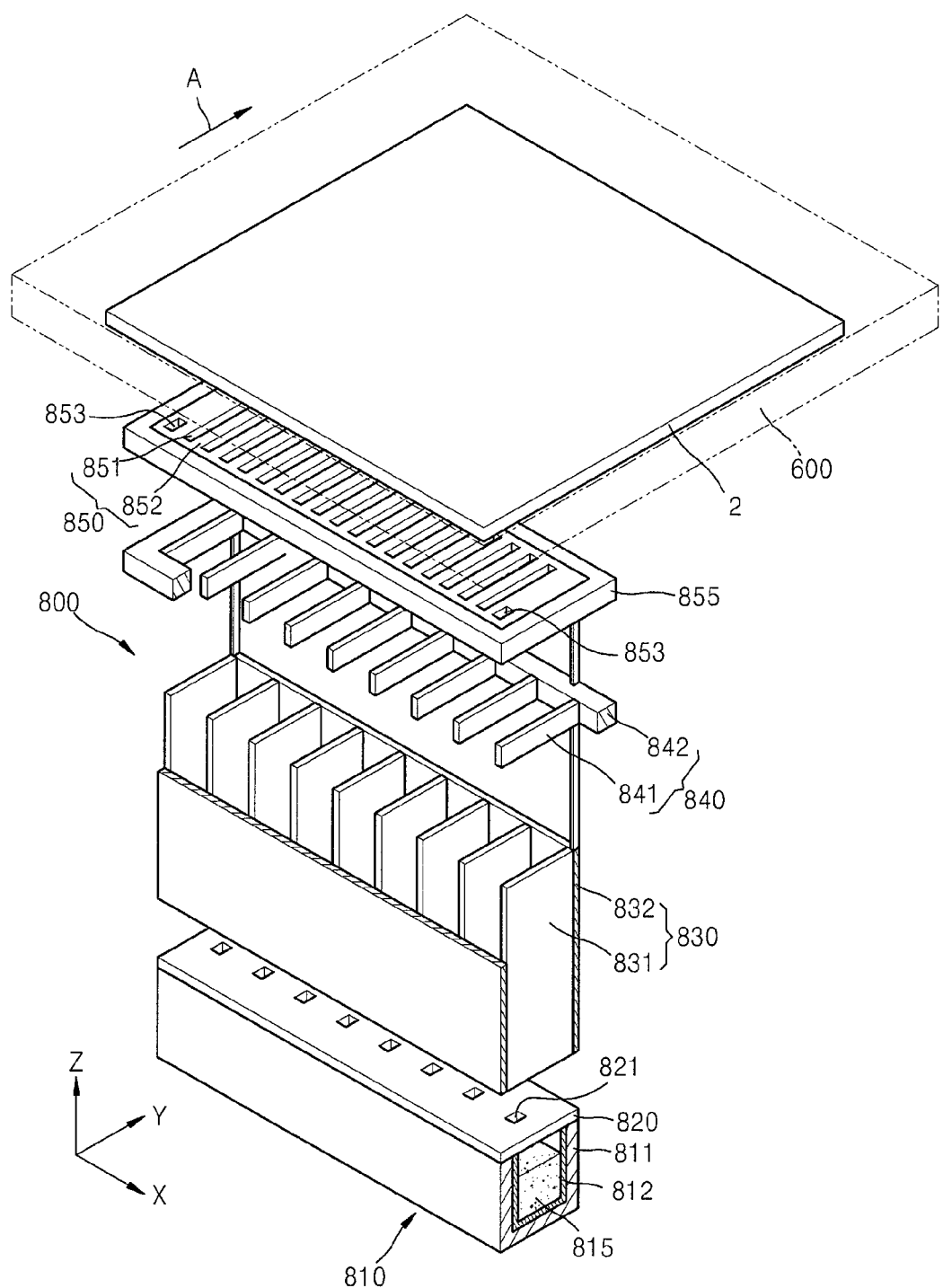
FIG. 9 is a schematic perspective view of an organic layer deposition assembly according to another embodiment of the present invention.

FIG. 9 is a schematic perspective view of an organic layer deposition assembly 800 according to another embodiment of the present invention. For convenience of description, the present embodiment is described in terms of features different from those of the previous embodiment.

Referring to FIG. 9, the organic layer deposition assembly 800 includes a deposition source 810, a deposition source nozzle unit 820, a first shielding plate assembly 830, a second shielding plate assembly 840, and a patterning slit sheet 850.

The patterning slit sheet 850 is disposed between the deposition source 810 and a substrate 2. The patterning slit sheet 850 is combined with a frame 855 having a shape similar to a window frame. The patterning slit sheet 850 includes a plurality of patterning slits 851 arranged in an X-axis direction. An intermediate region 852 is formed between the adjacent patterning slits 851, and alignment confirmation pattern slits 853 are formed in the outside of the patterning slits 851.

The patterning slit sheet 850 is equal to the aforementioned patterning slit sheet 130 and thus detailed descriptions thereof are omitted here.

Also, features of the deposition source 810 and the first shielding plate assembly 830 are the same as features of the previous embodiment of FIG. 6 and thus detailed descriptions thereof are omitted here. The present embodiment is different from the previous embodiment of FIG. 6 in that the second shielding plate assembly 840 is arranged at a side of the first shielding plate assembly 830.

In more detail, the second shielding plate assembly 840 includes a plurality of second shielding plates 841 and a second shielding plate frame 842 disposed on an outer side of the second shielding plates 841. The second shielding plates 841 may be disposed in parallel with each other along the X-axis direction. Also, the second shielding plates 841 may be disposed at regular intervals. Also, each of the second shielding plates 841 may extend along Y-Z planes, i.e., may be perpendicular to the X-axis direction.

A plurality of first shielding plates 831 and the second shielding plates 841, which are disposed in the aforementioned manner, partition a space between the deposition source nozzle unit 820 and the patterning slit sheet 850. That is, the present embodiment is characterized in that deposition spaces are partitioned respectively with respect to a plurality of deposition source nozzles 821 that spray deposition material, due to the first shielding plates 831 and the second shielding plates 841.

Here, the first shielding plates 831 and the second shielding plates 841 may be disposed to correspond to each other. In other words, the first shielding plates 831 may align with the second shielding plates 841, respectively, and thus may be in parallel with each other. That is, the first shielding plate 831 and the second shielding plate 841 that correspond to each other may be positioned on the same plane. Referring to FIG. 9, a length of each first shielding plate 831 is equal to an X-axis direction width of each second shielding plate 841 but aspects of the present invention are not limited thereto. That is, the second shielding plates 841 that are required to be accurately aligned with the adjacent patterning slits 851 may be relatively thin whereas the first shielding plates 831 that are not accurately aligned with the adjacent patterning slits 851 may be relatively thick for ease of manufacturing.

Also, a deposition process may proceed while the substrate 2 that is fixed onto an electrostatic chuck 600 moves with respect to the organic layer deposition assembly 800.

Although not illustrated, a plurality of the organic layer deposition assemblies 800 may be arranged, and a deposition process may proceed while the substrate 2 sequentially passes through the plurality of the organic layer deposition assemblies 800. Also, as in the aforementioned embodiment, the patterning slit sheet 850 of each of the organic layer deposition assemblies 800 in an organic layer deposition apparatus may include the alignment confirmation pattern slits 853 that are disposed while not overlapping with each other.

Figure 10:
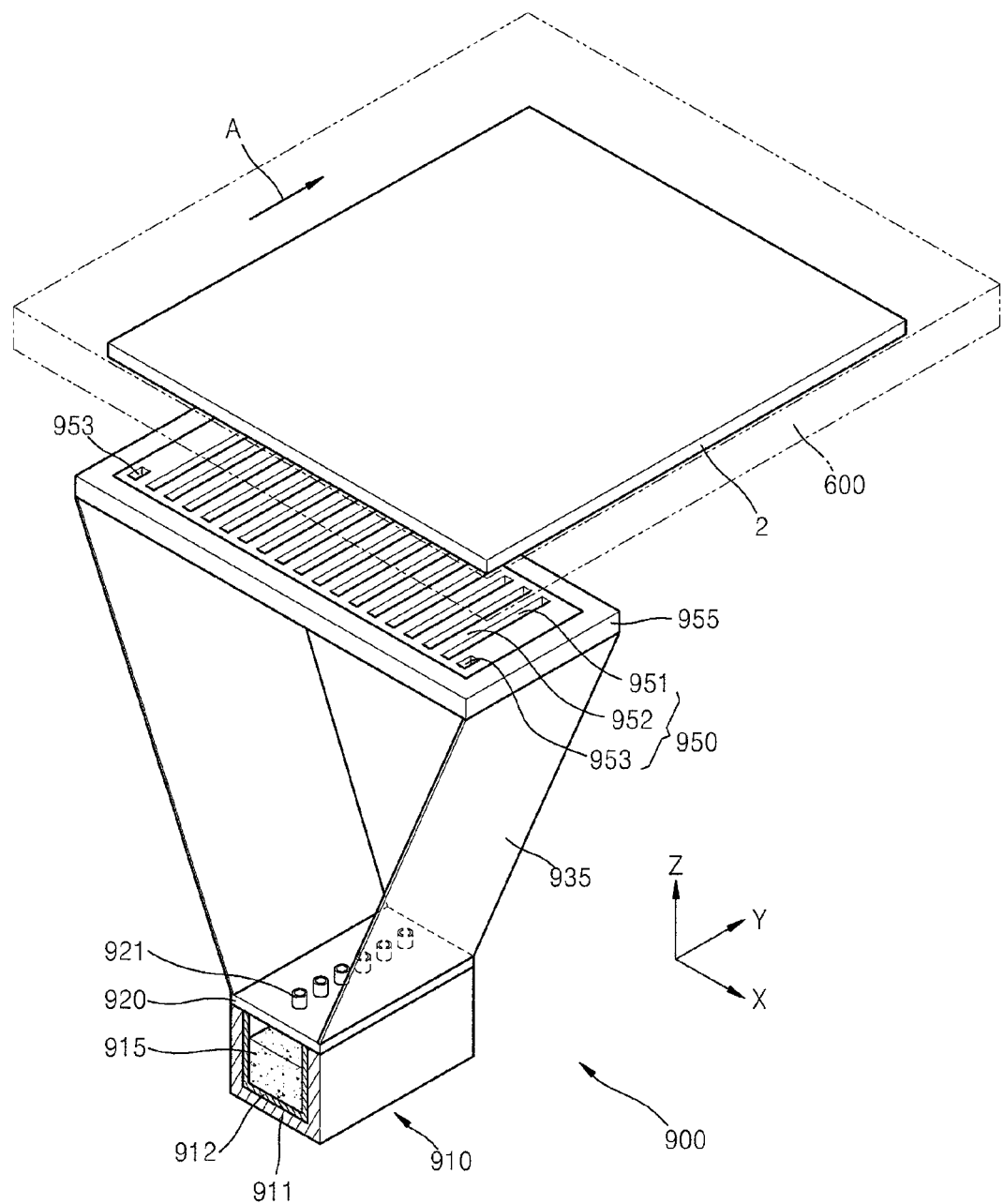
FIG. 10 is a schematic perspective view of an organic layer deposition assembly according to another embodiment of the present invention.

FIG. 10 is a schematic perspective view of an organic layer deposition assembly 900 according to another embodiment of the present invention. For convenience of description, the present embodiment is described in terms of features different from those of the previous embodiment.

Referring to FIG. 10, the organic layer deposition assembly 900 includes a deposition source 910, a deposition source nozzle unit 920, and a patterning slit sheet 950.

The patterning slit sheet 950 is disposed between the deposition source 910 and a substrate 2. The patterning slit sheet 950 is combined with a frame 955 having a shape similar to a window frame. The patterning slit sheet 950 includes a plurality of patterning slits 951 arranged in an X-axis direction. An intermediate region 952 is formed between the adjacent patterning slits 951, and alignment confirmation pattern slits 953 are formed in the outside of the patterning slits 951.

The patterning slit sheet 950 is equal to the aforementioned patterning slit sheet 130 and thus detailed descriptions thereof are omitted here.

The deposition source 910 includes a crucible 911 that is filled with a deposition material 915 and a heater 912 that heats the crucible 911 so as to vaporize a deposition material 915 included in the crucible 911 toward the deposition source nozzle unit 920. The deposition source nozzle unit 920 is disposed at a side of the deposition source 910, and a plurality of deposition source nozzles 921 are formed on the deposition source nozzle unit 920 along a Y-axis direction.

The deposition source 910, the deposition source nozzle unit 920, and the patterning slit sheet 950 are combined by using connection members 935.

A plurality of deposition source nozzles 921 are formed on the deposition source nozzle unit 920 along the Y-axis direction, i.e., a scanning direction of the substrate 2. Here, the deposition source nozzles 921 may be disposed at regular intervals. The deposition material 915 that has been vaporized in the deposition source 910 passes through the deposition source nozzle unit 920 and then moves toward the substrate 2 that is a deposition target. As a result, in the organic layer deposition assembly 900, the deposition source nozzles 921 are formed along the scanning direction of the substrate 2. In this regard, only one deposition source nozzle 921 is formed in the X-axis direction, and thus the occurrence of shadows may be significantly reduced. Also, since the deposition source nozzles 921 are formed along the scanning direction of the substrate 2, a difference in flux occurring between the deposition source nozzles 121 may be compensated for and deposition uniformity may be maintained constant.

Also, a deposition process may proceed while the substrate 2 that is fixed onto an electrostatic chuck 600 moves with respect to the organic layer deposition assembly 900.

Although not illustrated, a plurality of the organic layer deposition assemblies 900 may be arranged, and a deposition process may proceed while the substrate 2 sequentially passes through the plurality of the organic layer deposition assemblies 900. Also, as in the aforementioned embodiment, the patterning slit sheet 950 of each of the organic layer deposition assemblies 900 in an organic layer deposition apparatus may include the alignment confirmation pattern slits 953 that are disposed while not overlapping with each other.

Figure 11:
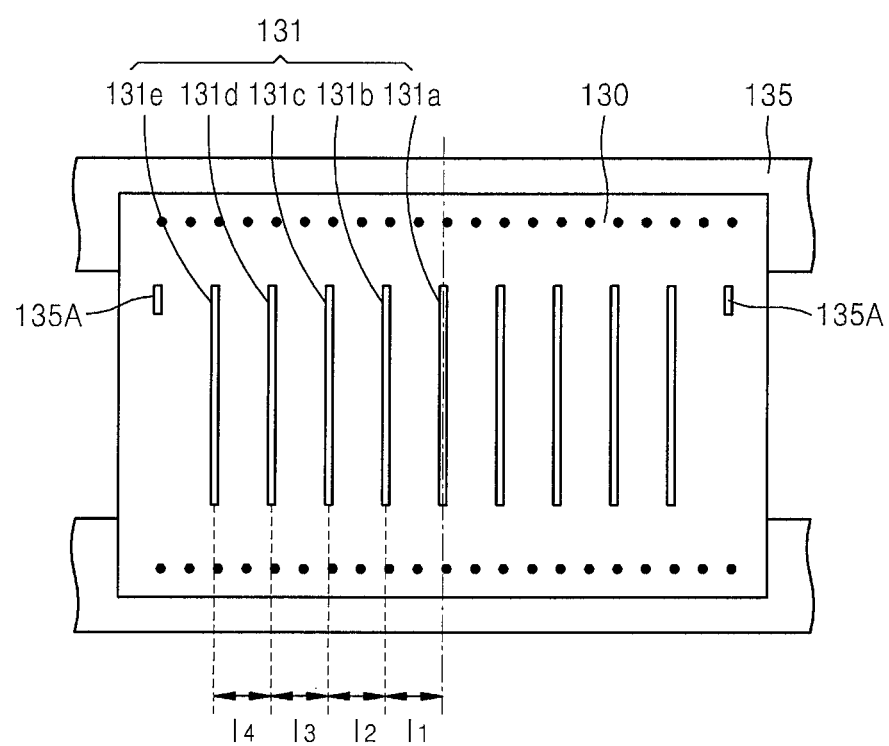
FIG. 11 is a diagram illustrating the patterning slit sheet of the organic layer deposition apparatus of FIG. 1 in which the patterning slits are arranged at equal intervals.
Figure 12:
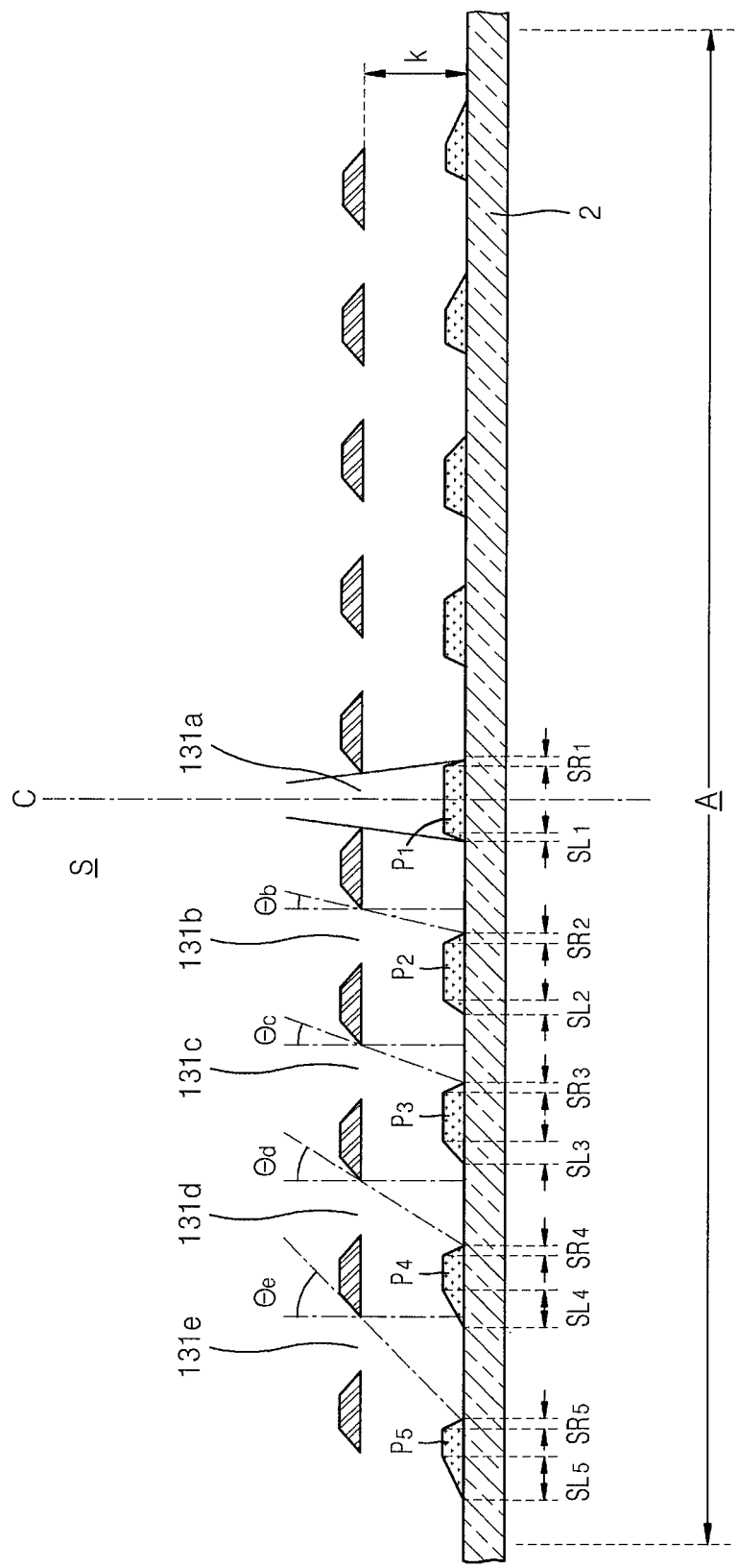
FIG. 12 is a diagram illustrating organic layers formed on a substrate by using the patterning slit sheet of FIG. 11, according to an embodiment of the present invention.

FIG. 11 is a diagram illustrating the patterning slit sheet 130 of the organic layer deposition apparatus 1 of FIG. 1 in which the patterning slits 131 are arranged at equal intervals. FIG. 12 is a diagram illustrating organic layers formed on a substrate by using the patterning slit sheet 130 of FIG. 11, according to an embodiment of the present invention.

FIGS. 11 and 12 illustrate the patterning slit sheet 130 in which the patterning slits 131 are arranged at equal intervals. That is, in FIG. 11, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer P1 formed using the deposition material that has passed through a patterning slit 131a has a minimum size of a shadow, and a right-side shadow $SR_1$ and a left-side shadow $SL_1$ are formed symmetrical to each other. Here, the deposition space S indicates a space in which a deposition pattern is formed on the substrate 2 by using the patterning slits 131 and not a space in which a pattern deposited by using an alignment confirmation pattern slit 135 is formed.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SL_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 12, the organic layers formed on the left side of the center line C of the deposition space S have a structure in which a left hypotenuse (left slanted side) is larger than a right hypotenuse (right slanted side), and the organic layers formed on the right side of the center line C of the deposition space S have a structure in which a right hypotenuse (right slanted side) is larger than a left hypotenuse (left slanted side).

Also, in the organic layers formed on the left side of the center line C of the deposition space S, the length of the left hypotenuse of the organic layers disposed farther from the center line C increases towards the left. In the organic layers formed on the right side of the center line C of the deposition space S, the length of the right hypotenuse of the organic layers disposed farther from the center line C increases towards the right. Consequently, the organic layers formed in the deposition space S may be formed symmetrical to each other about the center line C of the deposition space S.

In other words, the critical incident angles satisfy the following condition: $\theta_b<\theta_c<\theta_d<\theta_e$, and thus, the sizes of the shadows of the organic layers also satisfy the following condition: $SL_1<SL_2<SL_3<SL_4<SL_5$.

Figure 13:
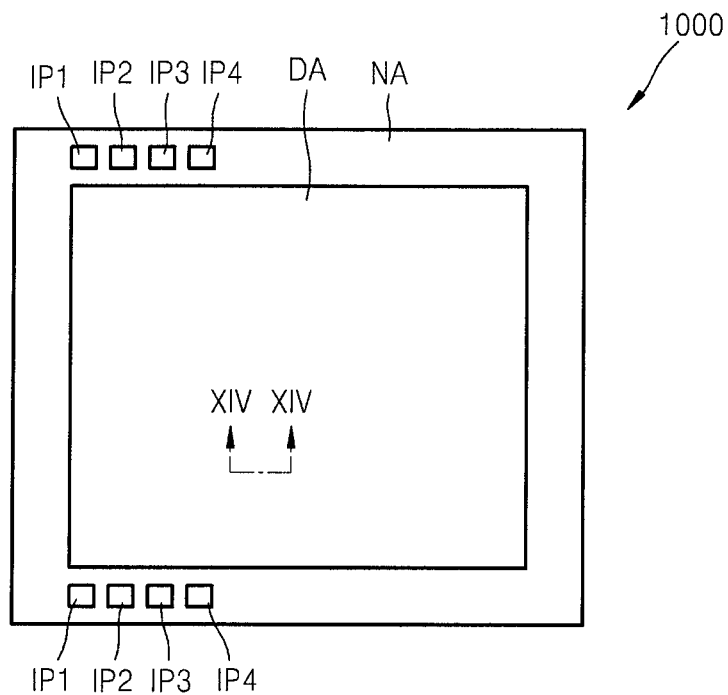
FIG. 13 is a plane view of an organic light-emitting display apparatus manufactured by using the organic layer deposition apparatus, according to an embodiment of the present invention.
Figure 14:
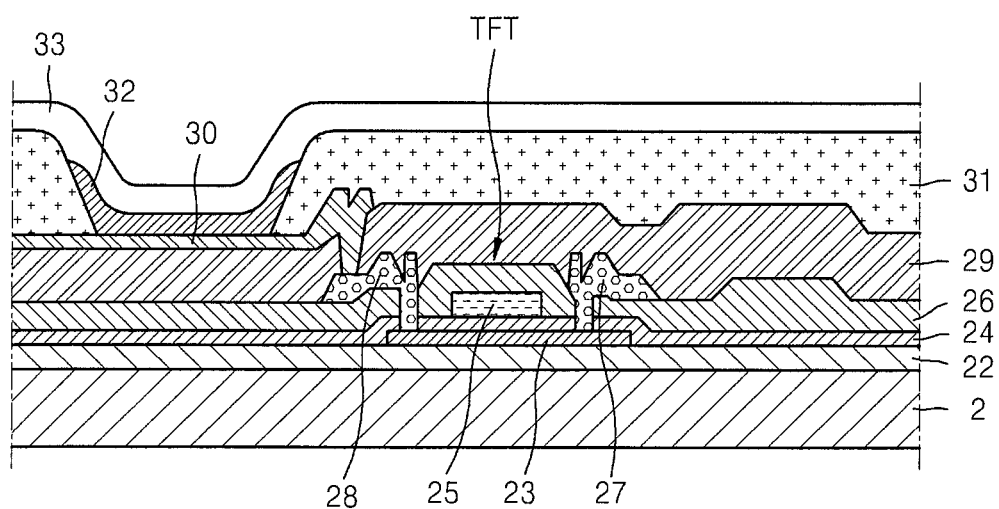
FIG. 14 is a cross-sectional view of the organic light-emitting display apparatus, taken along a line XIV-XIV of FIG. 13.

FIG. 13 is a plane view of an organic light-emitting display apparatus 1000 manufactured by using the organic layer deposition apparatus 1, according to an embodiment of the present invention. FIG. 14 is a cross-sectional view of the organic light-emitting display apparatus 1000, taken along a line XIV-XIV of FIG. 13.

Referring to FIGS. 13 and 14, the organic light-emitting display apparatus 1000 includes the substrate 2 that is partitioned by a display area DA and a non-display area NA.

The display area DA includes a plurality of pixels (not shown) to realize an image by emitting a visible ray. Also, as illustrated in FIG. 14, each of the pixels includes a first electrode 30, an intermediate layer 32 including an organic emission layer (organic EML), and a second electrode 33 which are formed on the substrate 2 (detailed descriptions will be provided).

The non-display area NA includes a plurality of alignment confirmation patterns IP1, IP2, IP3, and IP4. The alignment confirmation patterns IP1, IP2, IP3, and IP4 are formed at one time while the substrate 2 passes through the organic layer deposition assemblies 100-1 through 100-4 in the organic layer deposition apparatus 1 of FIG. 1. That is, the alignment confirmation patterns IP1, IP2, IP3, and IP4 are formed by using the alignment confirmation pattern slits 135A through 135D that are formed in the patterning slit sheets 130-1 through 130-4, respectively, as illustrated in FIGS. 5A through 5D. Also, the alignment confirmation patterns IP1, IP2, IP3, and IP4 may be formed by using the organic layer deposition assemblies 700, 800, and 900 according to the aforementioned other embodiments.

As described above, the alignment confirmation pattern slits 135A through 135D are formed while not overlapping with each other. By doing so, it is possible to easily check whether the patterning slit sheets 130-1 through 130-4 are correctly aligned with respect to the substrate 2. For example, when the alignment confirmation patterns IP1, IP2, IP3, and IP4 overlap with each other or are formed in undesired positions, the patterning slit sheets 130-1 through 130-4 may be realigned by adjusting positions of the patterning slit sheets 130-1 through 130-4 and then a deposition process may then proceed.

The display area DA of the organic light-emitting display apparatus 1000 will now be described with reference to FIG. 14.

A buffer layer 22 is formed on a substrate 2. The substrate 2 may be formed by using a glass material, a flexible plastic material, or other various materials. The buffer layer 22 prevents penetration of foreign substances into the substrate 2, and provides a planar surface on the substrate 2. The buffer layer 22 may be formed of various materials capable of performing the aforementioned functions. However, the buffer layer 22 is not an essential element and thus may be omitted.

An active layer 23 having a predetermined pattern is formed on the buffer layer 22. The active layer 23 may be formed of an inorganic semiconductor, such as amorphous silicon or polysilicon, or an organic semiconductor. The active layer 23 may include a source region, a drain region, and a channel region. The source region and the drain region of the active layer 23 may be formed by doping amorphous silicon or polysilicon with Group III impurities or Group V impurities.

A gate insulating layer 24 is formed on the active layer 23, and a gate electrode 25 is formed on a set or predetermined region on the gate insulating layer 24. The gate insulating layer 24 that insulates the active layer 23 from the gate electrode 25 may be formed of an organic material or an inorganic material, such as SiNx or SiO2.

The gate electrode 25 may be formed of a metal selected from the group consisting of Au, Ag, Cu, Ni, Pt, Pd, Al, and Mo, or may be formed of a metal alloy, such as Al—Nd alloy, Mo—W alloy, and the like. However, the gate electrode 25 is not limited thereto, and may be formed by using various materials in consideration of adhesion, planarization, electrical resistance, formability, or the like with respect to adjacent layers.

An interlayer insulating layer 26 is formed on the gate electrode 25. The interlayer insulating layer 26 and the gate insulating layer 24 may expose the source region and the drain region of the active layer 23, and a source electrode 27 and a drain electrode 28 are formed to respectively contact the exposed source and drain regions of the active layer 23.

The source electrode 27 and the drain electrode 28 may be formed by using various conductive materials and may have a single-layered structure or a mufti-layered structure.

A passivation layer 29 is formed on a thin-film transistor (TFT). In more detail, the passivation layer 29 is formed on the source electrode 27 and the drain electrode 28.

The passivation layer 29 does not cover an entire region of the drain electrode 28 but exposes a predetermined region of the drain electrode 28, and then a first electrode 30 is connected to the exposed region of the drain electrode 28.

A pixel-defining layer (PDL) 31 is formed on the first electrode 30. The PDL 31 exposes a set or predetermined region of the first electrode 30, and an intermediate layer 32, including an organic EML that contacts the exposed region of the first electrode 30, is formed. Afterward, a second electrode 33 is formed to be connected to the intermediate layer 32.

The intermediate layer 32, including the organic EML, may be formed as a small-molecule organic layer or a polymer organic layer. When the organic EML includes a small-molecule organic layer, a hole injection layer (HIL), a hole transport layer (HTL), an electron transport layer (ETL), an electron injection layer (EIL), or the like may be singularly or multiply stacked with the organic EML.

Here, the intermediate layer 32, including the organic EML, may be formed by using the apparatus or assemblies shown in FIGS. 1 through 10.

That is, after the first electrode 30 and the PDL 31 are formed on the substrate 2, the intermediate layer 32 may be formed by using the organic layer deposition apparatus 1 or the organic layer deposition assemblies 700, 800, and 900.

For example, in a case where the organic layer deposition apparatus 1 of FIG. 1 is used, a red organic EML, a green organic EML, a blue organic EML, and an auxiliary EML may be sequentially deposited onto the first electrode 30 on the substrate 2 by respectively using the organic layer deposition assemblies 100-1, 100-2, 100-3, and 100-4. Here, it is possible to easily form desired deposition patterns on the substrate 2 by easily checking alignment between the substrate 2 and the respective patterning slit sheets 130-1 through 130-4 of the organic layer deposition assemblies 100-1 through 100-4 by using the alignment confirmation patterns IP1, IP2, IP3, and IP4 that are formed by using the alignment confirmation pattern slits 135A through 135D.

The first electrode 30 may include indium tin oxide (ITO), indium zinc oxide (IZO), zinc oxide (ZnO), or indium oxide ($In_2O_3$). Alternatively, the first electrode 30 may include silver (Ag), magnesium (Mg), aluminum (Al), platinum (Pt), palladium (Pd), gold (Au), nickel (Ni), neodymium (Nd), iridium (Ir), chromium (Cr) or a compound thereof.

A second electrode 33 may include lithium (Li), calcium (Ca), lithium fluoride/calcium (LiF/Ca), lithium fluoride/aluminum (LiF/AI), aluminum (Al), silver (Ag), magnesium (Mg), or a compound thereof. Alternatively, the second electrode 62 may include ITO, IZO, ZnO, $In_2O_3$, or the like.

An encapsulation member (not shown) may be disposed on the second electrode 33. The encapsulation member may function to protect the intermediate layer 32 and other layers against external moisture or oxygen. The encapsulation member may be formed of a plastic material or may have a structure in which an organic material and an inorganic material are stacked.

An organic layer deposition assembly, an organic layer deposition apparatus, an organic light-emitting display apparatus and a method of manufacturing the organic light-emitting display apparatus, according to the one or more embodiments of the present invention, may easily improve a characteristic of a deposited layer.

While the present invention has been particularly shown and described with reference to exemplary embodiments thereof, it will be understood by those of ordinary skill in the art that various changes in form and details may be made therein without departing from the spirit and scope of the present invention as partitioned by the following claims, and equivalents thereof.

What is claimed is:

1. An organic layer deposition apparatus comprising a plurality of organic layer deposition assemblies for depositing deposition materials on a substrate, each of the plurality of organic layer deposition assemblies comprising:
a deposition source for discharging a deposition material of the deposition materials;
a deposition source nozzle unit disposed at a side of the deposition source, the deposition source nozzle unit comprising a plurality of deposition source nozzles; and
a patterning slit sheet facing the deposition source nozzle unit, the patterning slit sheet comprising a plurality of patterning slits and one or more alignment confirmation pattern slits at an outer region of the patterning slit sheet surrounding the plurality of patterning slits, each patterning slit of the plurality of patterning slits having a first length extending along a direction and each alignment confirmation pattern slit of the one or more alignment confirmation pattern slits having a second length extending along the direction, the second length being less than the first length, wherein the one or more alignment confirmation pattern slits in each of the plurality of organic layer deposition assemblies are aligned along the direction with the one or more alignment confirmation pattern slits in each of the other plurality of organic layer deposition assemblies, and wherein the one or more alignment confirmation pattern slits in each of the plurality of organic layer deposition assemblies are located at different positions along the direction relative to the plurality of patterning slits of the respective patterning slit sheet;

wherein the deposition source is configured to discharge the deposition material to pass through the plurality of patterning slit sheets and then on the substrate, while a deposition process is performed.

2. The organic layer deposition apparatus of claim 1, wherein, when the plurality of patterning slit sheets are aligned with respect to the substrate so as to deposit the deposition material on the substrate, the one or more alignment confirmation pattern slits, which are formed at the plurality of patterning slit sheets, respectively, do not overlap with each other.

3. The organic layer deposition apparatus of claim 1, wherein, while the substrate sequentially passes through the plurality of organic layer deposition assemblies, the plurality of patterning slit sheets are configured to deposit different deposition materials on the substrate, respectively, and wherein the one or more alignment confirmation pattern slits at the plurality of patterning slit sheets are configured to form alignment confirmation patterns on the substrate.

4. The organic layer deposition apparatus of claim 1, further comprising:

a conveyer unit comprising a transfer unit configured to fix the substrate thereto and to move along with the substrate, a first conveyer unit for moving in a first direction the transfer unit on which the substrate is fixed, and a second conveyer unit for moving in a direction opposite to the first direction the transfer unit from which the substrate is separated after deposition has been completed;

a loading unit for fixing the substrate on the transfer unit;

a chamber maintained in a vacuum state and in which the plurality of organic layer deposition assemblies are disposed; and an unloading unit for separating, from the transfer unit, the substrate on which the deposition has been completed while passing through the plurality of organic layer deposition assemblies, wherein the transfer unit is configured to cyclically move between the first conveyer unit and the second conveyer unit, and wherein the substrate fixed on the transfer unit is configured to be spaced apart from the plurality of organic layer deposition assemblies by a set distance while being transferred by the first conveyer unit.

5. The organic layer deposition apparatus of claim 4, wherein the first conveyer unit and the second conveyer unit are configured to pass through the plurality of organic layer deposition assemblies in the chamber.

6. The organic layer deposition apparatus of claim 4, wherein the first conveyer unit and the second conveyer unit are arranged above and below each other.

7. The organic layer deposition apparatus of claim 4, wherein the first conveyer unit is configured to sequentially convey the transfer unit to the loading unit, the chamber, and the unloading unit.

8. The organic layer deposition apparatus of claim 4, wherein the second conveyer unit is configured to sequentially convey the transfer unit to the unloading unit, the chamber, and the loading unit.

9. A method of manufacturing at least one organic layer of an organic light-emitting display apparatus using the organic layer deposition apparatus of claim 1, the method comprising:

passing the substrate sequentially through the plurality of organic layer deposition assemblies;

discharging the deposition materials sequentially from the deposition sources of the plurality of organic layer deposition assemblies, wherein the deposition material that is discharged from each of the deposition sources passes through the plurality of patterning slits in one of the patterning slit sheets and is deposited onto the substrate to form the at least one organic layer; and forming alignment confirmation patterns having the deposition material on the substrate by the discharging the deposition materials, the deposition material discharged from each of the deposition sources passing through the one or more alignment confirmation pattern slits in one of the patterning slit sheets when the at least one organic layer is formed, the alignment confirmation patterns being aligned and spaced apart from each other on the substrate when the organic layer deposition apparatus is properly aligned.

10. The method of claim 9, wherein the at least one organic layer that is formed by using the organic layer deposition apparatus is one layer comprised in an intermediate layer of the at least one organic layer.

11. The method of claim 9, wherein, while the substrate sequentially passes through the plurality of organic layer deposition assemblies, different deposition materials are deposited on the substrate via the plurality of patterning slit sheets, respectively.

12. The method of claim 9, wherein the forming of the at least one organic layer comprises:

fixing the substrate to a transfer unit by using a loading unit;

moving the transfer unit on which the substrate is fixed to a chamber, by using a first conveyer unit mounted to pass through the chamber;

when the plurality of organic layer deposition assemblies are in the chamber, and the substrate and the plurality of organic layer deposition assemblies in the chamber are spaced apart by a set distance, forming the at least one organic layer in a manner that, while the substrate relatively moves with respect to the plurality of organic layer deposition assemblies, deposition materials discharged from the plurality of organic layer deposition assemblies are deposited on the substrate;

separating, from the transfer unit, the substrate on which the deposition has been completed, by using an unloading unit; and moving the transfer unit, from which the substrate is separated, to the loading unit by using a second conveyer unit mounted to pass through the chamber.

\* \* \* \* \*